United States Patent
Nishi et al.

(10) Patent No.: US 10,024,919 B2
(45) Date of Patent: Jul. 17, 2018

(54) SYSTEM FOR DETERMINING FIXATION OF RELAY

(71) Applicant: TOYOTA JIDOSHA KABUSHIKI KAISHA, Toyota-shi, Aichi-ken (JP)

(72) Inventors: Yuji Nishi, Nagoya (JP); Yukinari Tanabe, Nagoya (JP); Hiroyuki Kaiya, Toyota (JP); Hiromasa Tanaka, Okazaki (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 134 days.

(21) Appl. No.: 15/021,132

(22) PCT Filed: Sep. 4, 2014

(86) PCT No.: PCT/IB2014/001702
§ 371 (c)(1),
(2) Date: Mar. 10, 2016

(87) PCT Pub. No.: WO2015/036824
PCT Pub. Date: Mar. 19, 2015

(65) Prior Publication Data
US 2016/0223615 A1   Aug. 4, 2016

(30) Foreign Application Priority Data

Sep. 11, 2013 (JP) .................................. 2013-188705
Feb. 12, 2014 (JP) .................................. 2014-024316

(51) Int. Cl.
G01R 31/327 (2006.01)
H01H 47/00 (2006.01)
(Continued)

(52) U.S. Cl.
CPC ..... *G01R 31/3278* (2013.01); *G01R 19/0084* (2013.01); *H01H 47/002* (2013.01); *H02H 9/001* (2013.01); *G01R 31/006* (2013.01)

(58) Field of Classification Search
CPC .................................................. G01R 31/3278
See application file for complete search history.

(56) References Cited

U.S. PATENT DOCUMENTS 7,242,196 B2 * 7/2007 Yudahira .............. B60L 3/0023
                                                                  324/418
2009/0134881 A1 * 5/2009 Tachizaki ............. B60L 3/0023
                                                                  324/551
(Continued)

FOREIGN PATENT DOCUMENTS

JP   2000-134707 A   5/2000
JP   2005-149843 A   6/2005
(Continued)

*Primary Examiner* — Walter L Lindsay, Jr.
*Assistant Examiner* — Milton Gonzalez
(74) *Attorney, Agent, or Firm* — Sughrue Mion, PLLC

(57) ABSTRACT

A system for determining fixation of a relay has an electricity storage device, an electrical apparatus, a relay, a first insulation resistor, a second insulation resistor, a detection circuit, and a controller. When the relay is controlled to OFF, the controller determines, based on the voltage value detected by the detection circuit (the detected voltage value), whether or not the relay is fixed. When the detected voltage value is a voltage value that is obtained by dividing the reference voltage value by a combined resistance value and the reference resistance value, the controller determines that the relay is fixed. When the detected voltage value is a voltage value that is obtained by dividing the reference voltage value by the first resistance value and the reference resistance value, the controller determines that the relay is not fixed.

8 Claims, 11 Drawing Sheets

(51) Int. Cl.
*H02H 9/00* (2006.01)
*G01R 19/00* (2006.01)
*G01R 31/00* (2006.01)

(56) References Cited

U.S. PATENT DOCUMENTS

| | | | | |
|---|---|---|---|---|
| 2012/0025844 A1* | 2/2012 | Morita | ............ | B60L 3/0023 |
| | | | | 324/538 |
| 2012/0274131 A1* | 11/2012 | Makino | ............ | B60L 3/0069 |
| | | | | 307/9.1 |
| 2014/0039740 A1* | 2/2014 | Kwon | ............ | G06F 17/00 |
| | | | | 701/22 |
| 2015/0060423 A1 | 3/2015 | Tanaka et al. | | |

FOREIGN PATENT DOCUMENTS

| | | |
|---|---|---|
| JP | 2005-222871 A | 8/2005 |
| JP | 2007-329045 A | 12/2007 |
| JP | 2010-178454 A | 8/2010 |
| JP | 2015-65143 A | 4/2015 |

* cited by examiner

SYSTEM FOR DETERMINING FIXATION OF RELAY

CROSS REFERENCE TO RELATED APPLICATIONS

This application is a National Stage of International Application No. PCT/IB2014/001702 filed Sep. 4, 2014, claiming priority based on Japanese Patent Application Nos. 2013-188705 filed Sep. 11, 2013, and 2014-024316 filed Feb. 12, 2014, the contents of all of which are incorporated herein by reference in their entirety.

BACKGROUND OF THE INVENTION

1. Field of the Invention

The invention relates to a system for determining whether or not a relay is fixed.

2. Description of Related Art

A battery pack is connected to an electrical apparatus (including a load) by a positive electrode line and a negative electrode line. The positive electrode line and the negative electrode line are each provided with a relay. The battery pack and the electrical apparatus can be connected to or disconnected from each other by switching these relays ON and OFF.

Each of the relays has a movable contact point and a fixed contact point, wherein the movable contact point could get fixed to the fixed contact point. When this happens, the relay with its movable contact point fixed to its fixed contact point, stays ON. In this situation, it is needed to be determined that whether or not such relay fixation occurs. For instance, in order to determine fixation of a specific relay out of a plurality of relays, the specific relay is turned OFF, while the rest of the relays are turned ON. The fact that the specific relay is fixed and remains ON can be determined by detecting, with a current sensor or a voltage sensor, that the battery pack and the electrical apparatus are connected to each other.

SUMMARY OF THE INVENTION

When controlling the relays to ON and OFF to determine whether any of the relays is fixed or not as described above, control for turning the other relays ON needs to be executed. In so doing, every time when determining whether any of the relays is fixed or not, the movable contact point of each relay comes into contact with the corresponding fixed contact point in response to the control for turning the relays ON. This causes wear on the relays (the movable contact points and the fixed contact points).

In a first aspect of the invention, a system for determining fixation of a relay has an electricity storage device, an electrical apparatus, a relay, a first insulation resistor, a second insulation resistor, a detection circuit, and a controller. The relay is provided on a line connecting the electricity storage device and the electrical apparatus. The relay has a movable contact point and a fixed contact point. The detection circuit outputs an alternating-current (AC) signal of a reference voltage value to the electricity storage device and detects a voltage value obtained by dividing the reference voltage value by a reference resistance value. When the relay is controlled to OFF, the controller determines, based on the voltage value detected by the detection circuit (the detected voltage value), whether or not the relay is ON and fixed.

The system for determining fixation of a relay has the first insulation resistor between the electricity storage device and a ground and the second insulation resistor between the electrical apparatus and the ground. A first resistance value of the first insulation resistor is larger than a second resistance value of the second insulation resistor. When the detected voltage value is a voltage value that is obtained by dividing the reference voltage value by a combined resistance value and the reference resistance value, the controller determines that the relay is fixed. The combined resistance value is a combined value of the first resistance value and the second resistance value. When the detected voltage value is a voltage value that is obtained by dividing the reference voltage value by the first resistance value and the reference resistance value, the controller determines that the relay is not fixed.

In a second aspect of the invention, the system for determining fixation of a relay has an electricity storage device, an electrical apparatus, a relay, a detection circuit, and a controller. The relay is provided on a line connecting the electricity storage device and the electrical apparatus. The relay has a movable contact point and a fixed contact point. The detection circuit outputs an AC signal of a reference voltage value to the electricity storage device and detects a voltage value obtained by dividing the reference voltage value by a reference resistance value. When the relay is controlled to OFF, the controller determines, based on the voltage value detected by the detection circuit (the detected voltage value), whether or not the relay is ON and fixed.

When the detected voltage value is a voltage value that is obtained by dividing the reference voltage value by a combined resistance value and the reference resistance value, the controller determines that the relay is fixed. The combined resistance value is combined value of a first resistance value a second resistant value. When the detected voltage value is a voltage value that is obtained by dividing the reference voltage value by the first resistance value and the reference resistance value, the controller determines that the relay is not fixed. The first resistance value is a resistance value of the insulation resistor between the electricity storage device and a ground. The second resistance value is a resistance value of the insulation resistor between the electrical apparatus and the ground. The first resistance value is higher than the second resistance value.

In a third aspect of the invention, the system for determining fixation of a relay has an electricity storage device, an electrical apparatus, a relay, a first insulation resistor, a second insulation resistor, a detection circuit, and a controller. The relay is provided on a line connecting the electricity storage device and the electrical apparatus. The relay has a movable contact point and a fixed contact point. The detection circuit outputs an AC signal of a reference voltage value to the electricity storage device and detects a voltage value obtained by dividing the reference voltage value by a reference resistance value. When the relay is controlled to OFF, the controller determines, based on the voltage value detected by the detection circuit (the detected voltage value), whether or not the relay is ON and fixed.

The system for determining fixation of a relay has the first insulation resistor between the electricity storage device and a ground and the second insulation resistor between the electrical apparatus and the ground. A first resistance value of the first insulation resistor is larger than a second resistance value of the second insulation resistor. When a resistance value calculated from the detected voltage value, reference voltage value, and reference resistance value is a combined resistance value of the first and second resistance values, the controller determines that the relay is fixed. When this calculated resistance value is the first resistance value, the controller determines that the relay is not fixed.

In a fourth aspect of the invention, the system for determining fixation of a relay has an electricity storage device, an electrical apparatus, a relay, a detection circuit, and a controller. The relay is provided on a line connecting the electricity storage device and the electrical apparatus. The relay has a movable contact point and a fixed contact point. The detection circuit outputs an AC signal of a reference voltage value to the electricity storage device and detects a voltage value obtained by dividing the reference voltage value by a reference resistance value. When the relay is controlled to OFF, the controller determines, based on the voltage value detected by the detection circuit (the detected voltage value), whether or not the relay is ON and fixed.

When a resistance value calculated from the detected voltage value, reference voltage value, and reference resistance value is a combined resistance value of first and second resistance values, the controller determines that the relay is fixed. When this calculated resistance value is the first resistance value, the controller determines that the relay is not fixed. The first resistance value is a resistance value of the insulation resistor between the electricity storage device and a ground. The second resistance value is a resistance value of the insulation resistor between the electrical apparatus and the ground. The first resistance value is higher than the second resistance value.

In the foregoing aspect, when the relay is not fixed, the AC signal that is output from the detection circuit is supplied only to the electricity storage device, and the detected voltage value becomes the voltage value obtained by dividing the reference voltage value by the first resistance value and the reference resistance value. In other words, when the relay is not fixed, the resistance value calculated from the detected voltage value, reference voltage value, and reference resistance value becomes the first resistance value.

When, on the other hand, the relay is fixed, the AC signal that is output from the detection circuit is supplied not only to the electricity storage device but also to the electrical apparatus via the fixed relay. The detected voltage value at this moment is the voltage value that is obtained by dividing the reference voltage value by a combined resistance value and the reference resistance value. The combined resistance value is a combined value of the first resistance value and second resistance value. In other words, this calculated resistance value is the combined resistance value of the first and second resistance values.

Since the first resistance value is larger than the second resistance value, the detected voltage value obtained when the relay is fixed is different from the detected voltage value obtained when the relay is not fixed. Whether or not the relay is fixed can be determined by confirming the detected voltage value. When determining whether or not the relay is fixed, the AC signal only needs to be supplied to the electricity storage device while keeping the relay OFF. Therefore, it is not necessary to switch the relay ON and OFF in order to determine whether or not the relay is fixed, preventing wear of the relay (the movable contact point and the fixed contact point).

In the foregoing aspect, when determining, based on the detected voltage value, a decrease in the first resistance value resulting from a leak in the electricity storage device, the detection circuit may output an AC signal of a first frequency. Also when determining, based on the detected voltage value, whether or not the relay is fixed, the detection circuit may output an AC signal of a second frequency lower than the first frequency.

The higher the frequency of the AC signal, the smaller the voltage difference between the detected voltage obtained when the relay is fixed and the detected voltage obtained when the relay is not fixed. When the voltage difference becomes small, it becomes difficult to distinguish between the detected voltage value obtained when the relay is fixed and the detected voltage value obtained when the relay is not fixed. This makes it difficult to determine based on the detected voltage value whether or not the relay is fixed. For this reason, it is preferred that the voltage difference be made large and that the frequency of the AC signal be made low in order to easily determine whether the relay is fixed or not.

When determining, based on the detected voltage value, a decrease of the first resistance value resulting from a leak in the electricity storage device, the lower the frequency of the AC signal becomes, the longer it takes to specify the detected voltage value. This makes it longer to determine a decrease of the first resistance value. It is, therefore, preferred that the frequency of the AC signal be made high in order to reduce the processing time it takes to determine a decrease of the first resistance value. When outputting an AC signal, the detection circuit can set two frequencies (a first frequency and a second frequency).

When determining a decrease of the first resistance value resulting from a leak in the electricity storage device, an AC signal of the first frequency is used. This enables the determination of a decrease of the first resistance value quicker than when an AC signal of the second frequency lower than the first frequency is used. Furthermore, when determining whether the relay is fixed or not, the AC signal of the second frequency is used. This facilitates the determination of the fixation of the relay more easily than when the AC signal of the first frequency higher than the second frequency is used.

When the frequency of the AC signal output from the detection circuit is switched between the first frequency and the second frequency, it is necessary to determine whether or not a normal frequency is set in the AC signal output from the detection circuit. Switching the frequency of the AC signal changes the detected voltage value. In other words, even when the control for switching the frequency of the AC signal is executed, no change in the detected voltage value means that the frequency is not switched.

In the foregoing aspect, therefore, when the detected voltage value that is obtained when the AC signal of the first frequency is used is equal to the detected voltage value that is obtained when the AC signal of the second frequency is used, the controller may determine that the output states of the AC signals from the detection circuit are abnormal.

Prior to determining whether or not the relay is fixed, whether or not the first resistance value has dropped due to a leak in the electricity storage device can be used to determine based on the detected voltage value. When the first resistance value has not dropped, whether the relay is fixed or not can be determined using the detected voltage value. When the first resistance value has dropped, then the detected voltage value changes, causing errors in determining whether the relay is fixed or not.

In the foregoing aspect, therefore, the controller may determine whether or not the relay is fixed, after confirming that the first resistance value has not dropped. With this configuration, fixation of the relay can be determined accurately.

In the foregoing aspect, the relay may include a first relay and a second relay. The first relay is provided on a line connecting a positive electrode terminal of the electricity storage device and the electrical apparatus. The second relay is provided on a connecting a negative electrode line of the electricity storage device and the electrical apparatus. The movable contact points of the first and second relays may mechanically be connected to each other so as to be integrally operated.

When determining, based on the results of detection by a current sensor or a voltage sensor, whether or not the relay is fixed, the detection result obtained when the first relay and the second relay are OFF is equal to the detection result obtained when one of the first and second relays is OFF and the other one is fixed. In this case, it cannot be determined that one of the first and second relays is OFF and that the other one is fixed.

According to the foregoing aspect, the detected voltage value more varies when at least either one of the first and second relays is fixed than when neither of the first and second relays is fixed. By confirming the detected voltage value, the state in which the first and second relays are OFF can be distinguished from the state in which either one of the first and second relays is OFF while the other one is fixed.

In a fifth aspect of the invention, the system for determining fixation of a relay has an electricity storage device, an electrical apparatus, a relay, a detection circuit, and a controller. The relay is provided on a line connecting the electricity storage device and the electrical apparatus. The relay has a movable contact point and a fixed contact point. The detection circuit outputs an AC signal of a reference voltage value to the electricity storage device and detects a voltage value obtained by dividing the reference voltage value by a reference resistance value. The detection circuit then detects a voltage value that is obtained by dividing the reference voltage value by a combined resistance value and the reference resistance value. The combined resistance value is a combined resistance value of a first resistance value and a second resistance value. The first resistance value is a resistance value of the insulation resistance between the electricity storage device and a ground. The second resistance value is a resistance value of the insulation resistance between the electrical apparatus and the ground. The first resistance value is higher than the second resistance value. The controller determines, based on the first detected voltage value and the second detected voltage value, whether or not the relay is ON and fixed. The first detected voltage value is detected by the detection circuit when the relay is controlled to OFF. The second detected voltage value is detected by the detection circuit when the relay is controlled to ON.

When a first voltage at least one of difference and a second voltage difference is smaller than a predetermined value, the controller determines that the relay is fixed. When, on the other hand, at least one of the first voltage difference and the second voltage difference is larger than the predetermined value, the controller determines that the relay is not fixed. The first voltage difference is a voltage difference between the second detected voltage value that is detected before the relay is controlled to OFF when charging/discharging between the electricity storage device and the electrical apparatus is ended, and the first detected voltage value that is detected after the relay is controlled to OFF in response to the completion of the charging/discharging. The second voltage difference is a voltage difference between the first detected voltage value that is detected before the relay is controlled to ON when charging/discharging between the electricity storage device and the electrical apparatus is started, and the second detected voltage value that is detected after the relay is controlled to ON in response to the start of the charging/discharging.

In the foregoing aspect, the first resistance value is higher than the second resistance value. Therefore, the detected voltage value obtained when the relay is fixed is different from the detected voltage value obtained when the relay is not fixed. In other words, when the relay is fixed, the voltage difference (differential value) between the first detected voltage value obtained prior to controlling the relay to ON and the second detected voltage value obtained prior to controlling the relay to OFF, becomes small. Determining based on this voltage difference that the relay is fixed, can minimize the individual differences among the circuit elements of the detection circuit and between the first and second insulation resistors and realize determination of whether the relay is fixed or not.

In addition, the first detected voltage value and the second detected voltage value are acquired in response to the execution of control for turning the relay OFF when the charging/discharging between the electricity storage device and the electrical apparatus is ended and the execution of control for turning the relay ON when the charging/discharging between the electricity storage device and the electrical apparatus is started. It is, therefore, not necessary to switch the relay ON and OFF in order to determine whether the relay is fixed or not, preventing wear of the relay (the movable contact point and the fixed contact point). Moreover, the first detected voltage value and the second detected voltage value can be acquired within a short period of time in response to the execution of control for turning the relay OFF when the charging/discharging between the electricity storage device and the electrical apparatus is ended and the execution of control for turning the relay ON when the charging/discharging between the electricity storage device and the electrical apparatus is started. Therefore, not only is it possible to prevent wear of the relay, but also the characteristic differences among the circuit elements of the detection circuit and between the first and second insulation resistors resulting from changes in temperature can be minimized.

In a sixth aspect of the invention, the system for determining fixation of a relay has an electricity storage device, an electrical apparatus, a relay, a detection circuit, and a controller. The relay is provided on a line connecting the electricity storage device and the electrical apparatus. The relay has a movable contact point and a fixed contact point. The detection circuit outputs an AC signal of a reference voltage value to the electricity storage device, detects a voltage value obtained by dividing the reference voltage value by a reference resistance value, and detects a voltage value that is obtained by dividing the reference voltage value by a combined resistance value and the reference resistance value, the combined resistance value is a value of first and second resistance values. The first resistance value is a resistance value of the insulation resistor between the electricity storage device and a ground. The second resistance value is a resistance value of the insulation resistor between the electrical apparatus and the ground. The first resistance value is higher than the second resistance value. The controller determines, based on a first detected voltage value and a second detected voltage value, whether or not the relay is ON and fixed.

When a first resistance difference or a second resistance difference is smaller than a predetermined value, the controller determines that the relay is fixed. When, on the other hand, the first resistance difference or the second resistance difference is larger than the predetermined value, the controller determines that the relay is not fixed. The first detected voltage value is detected by the detection circuit when the relay is controlled to OFF. The second detected voltage value is detected by the detection circuit when the relay is controlled to ON. The first resistance difference is a difference between a second calculated resistance value and a first calculated resistance value. The second resistance difference is a difference between a third calculated value and a forth calculated value. The second calculated resistance value is a value which is calculated from the second detected voltage value detected before the relay is controlled to OFF when charging/discharging between the electricity storage device and the electrical apparatus is ended, the reference voltage value, and the reference resistance value. The first calculated resistance value is a value which is calculated from the first detected voltage value detected after the relay is controlled to OFF in response to the completion of the charging/discharging, the reference voltage value, and the reference resistance value. The third calculated resistance value is a value which is calculated from the first detected voltage value detected before the relay is controlled to ON when charging/discharging between the electricity storage device and the electrical apparatus is started, the reference voltage value, and the reference resistance value. The forth calculated resistance value is a value which is calculated from the second detected voltage value detected after the relay is controlled to ON in response to the start of the charging/discharging, the reference voltage value, and the reference resistance value.

According to this aspect, the first resistance value of the insulation resistor between the electricity storage device and the ground (the first insulation resistor) is higher than the second resistance value of the insulation resistor between the electrical apparatus and the ground (the second insulation resistor). Thus, the calculated resistance value obtained when the relay is fixed is different from the calculated resistance value obtained when the relay is not fixed. In other words, when the relay is fixed, the resistance difference (the differential value) between the first calculated resistance value obtained prior to controlling the relay to ON and the second calculated resistance value obtained prior to controlling the relay to OFF, becomes small. Determining based on this resistance difference that the relay is fixed, can minimize the individual differences among the circuit elements of the detection circuit and between the first and second insulation resistors and realize determination of whether or not the relay is fixed. In addition, as with the fifth aspect, the configuration described in the sixth aspect can not only prevent wear of the relay (the movable contact point and the fixed contact point) but also minimize the characteristic differences among the circuit elements of the detection circuit and between the first and second insulation resistors resulting from changes in temperature.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
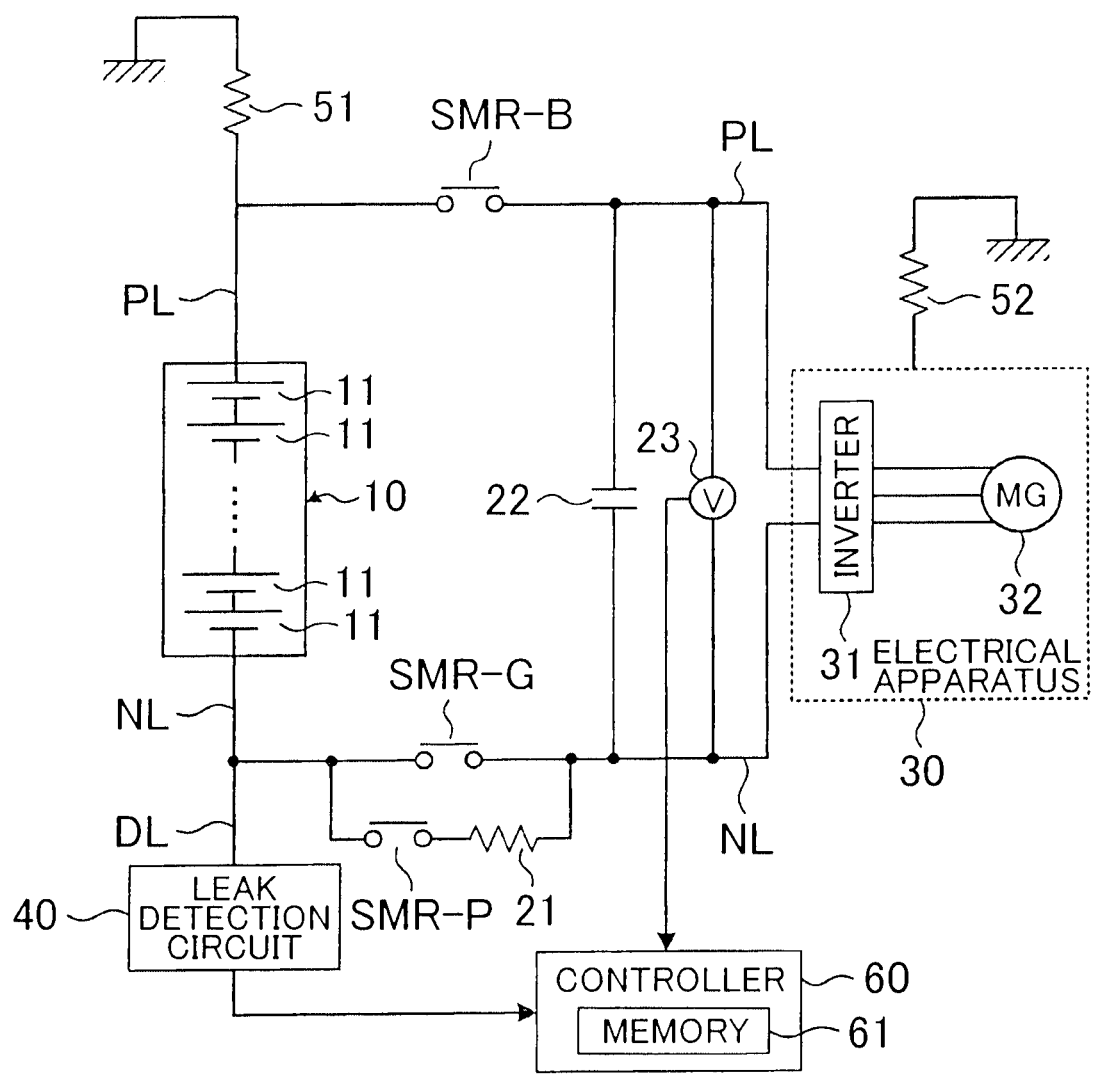
FIG. 1 is a diagram showing a configuration of a battery system according to Embodiment 1.

Embodiments of this invention are described hereinbelow.

A battery system according to an embodiment is now described. The battery system can be mounted in a vehicle.

A battery pack (same as the electricity storage device of this invention) 10 has a plurality of single batteries 11 connected in series. Secondary batteries such as nickel-hydrogen batteries or lithium-ion batteries can be used as the single batteries 11. In place of the secondary batteries, an electric double-layer capacitor can be used as well. Note that the battery pack 10 may include a plurality of single batteries 11 connected in parallel. The battery pack 10 is disposed insulated from the body of a vehicle provided as the ground. A resistance element 51 represents an insulation resistor between the battery pack 10 and the vehicle body (same as the first insulation resistor of this invention).

A positive electrode line (also referred to as "electrode line") PL is connected to a positive electrode terminal of the battery pack 10, and a negative electrode line (also referred to as "electrode line") NL to a negative electrode terminal of the battery pack 10. The battery pack 10 is connected to an inverter 31 by the positive electrode line PL and the negative electrode line NL. A system main relay SMR-B provided on the positive electrode line PL is switched ON and OFF in response to control signals from a controller 60.

A system main relay SMR-G provided on the negative electrode line NL is switched ON and OFF in response to control signals from the controller 60. A system main relay SMR-P and a resistance element 21 are connected in parallel to the system main relay SMR-G and in series to each other. The system main relay SMR-P is switched ON and OFF in response to control signals from the controller 60.

A capacitor 22 is connected to the positive electrode line PL and negative electrode line NL. The capacitor 22 is used to smooth a voltage value between the positive electrode line PL and the negative electrode line NL. A voltage sensor 23 detects the voltage value between the positive electrode line PL and the negative electrode line NL, or the voltage value of the capacitor 22, and outputs the result of the detection to the controller 60.

The resistance element 21 is used to prevent the flow of an inrush current from the battery pack 10 to the capacitor 22. When connecting the battery pack 10 to the inverter 31, the controller 60 switches the system main relays SMR-B and SMR-P from the OFF-states to the ON-states. This allows a current to flow from the battery pack 10 to the capacitor 22 via the resistance element 21.

In response to the completion of charging of the capacitor 22, the controller 60 switches the system main relay SMR-G from its OFF-state to its ON-state and the system main relay SMR-P from its ON-state to its OFF-state. As a result, the connection between the battery pack 10 and the inverter 31 is established, activating the battery system shown in FIG. 1 (Ready-ON). On the other hand, switching the system main relays SMR-B and SMR-G OFF during this activated state of the battery system leads to a disconnection between the battery pack 10 and the inverter 31, causing the battery system shown in FIG. 1 to stop (Ready-OFF).

The inverter 31 converts a direct-current (DC) power output from the battery pack 10 into an AC power and outputs the AC power to a motor generator 32. In response to the AC power from the inverter 31, the motor generator 32 generates kinetic energy to run the vehicle. The motor generator 32 also converts the kinetic energy generated upon braking the vehicle, into an AC power. The inverter 31 converts an AC power output from the motor generator 32 into a DC power and outputs the DC power to the battery pack 10. As a result, the battery pack 10 is charged.

A leak detection circuit (same as the detection circuit of this invention) 40 is used to determine whether or not there is a leak in the battery pack 10. The leak detection circuit 40 is also used to determine whether the system main relays SMR-B, SMR-G, and SMR-P are fixed. When the system main relays SMR-B, SMR-G, and SMR-P are fixed, then the system main relays SMR-B, SMR-G, and SMR-P remain ON. The leak detection circuit 40 is connected to the negative electrode line NL by a detection line DL. Information detected by the leak detection circuit 40 are output to the controller 60, as described hereinafter.

The controller 60 has a memory 61 in which predetermined information are stored. The memory 61 can be embedded in the controller 60 as shown in FIG. 1 or provided outside the controller 60.

The battery pack 10 is connected to the inverter 31 in this embodiment; however, the configuration is not limited thereto. Specifically, a boosting circuit can be provided on the current path between the battery pack 10 and the inverter 31. The boosting circuit boosts the output voltage of the battery pack 10 and outputs the resultant power to the inverter 31. The boosting circuit also drops the output voltage of the inverter 31 and outputs the resultant power to the battery pack 10.

An electrical apparatus 30 with the inverter 31 and motor generator 32 is disposed insulated from the body of the vehicle provided as the ground. A resistance element 52 represents an insulation resistor between the electrical apparatus 30 and the vehicle body (same as the second insulation resistor of this invention). A resistance value of the insulation resistor 51 (same as the first resistance value of this invention) $R_{IB}$ is higher than a resistance value of the insulation resistor 52 (same as the second resistance value of this invention) $R_{IL}$. For instance, the number of digits is different between the resistance values $R_{IB}$ and $R_{IL}$. Because the electrical apparatus 30 has the electronic components connected to the ground, the resistance value $R_{IL}$ tends to be low. The battery pack 10 on the other hand, is a high-voltage power supply and therefore needs to ensure insulation between the battery pack 10 and the ground. Therefore, the resistance value $R_{IB}$ tends to be high.

The electrical apparatus 30 is an electric circuit or load connected to the battery pack 10 and is not limited to the inverter 31 or the motor generator 32. For example, in case of operating an air conditioner (not shown) mounted in the vehicle by using the output power of the battery pack 10 this air conditioner is included in the electrical apparatus 30. Also, when mounting a charger 71 in the vehicle as shown in FIG. 2, the charger 71 is included in the electrical apparatus 30 as well.

The charger 71 is used to charge the battery pack 10 by supplying power from a commercial power supply (not shown) installed outside the vehicle to the battery pack 10. Charging the battery pack 10 using the power from the commercial power supply is called "external charging." In the external charging, the charger 71 converts an AC power of the commercial power supply into a DC power and outputs the DC power to the battery pack 10. The controller 60 can control the operations of the charger 71.

Figure 2:
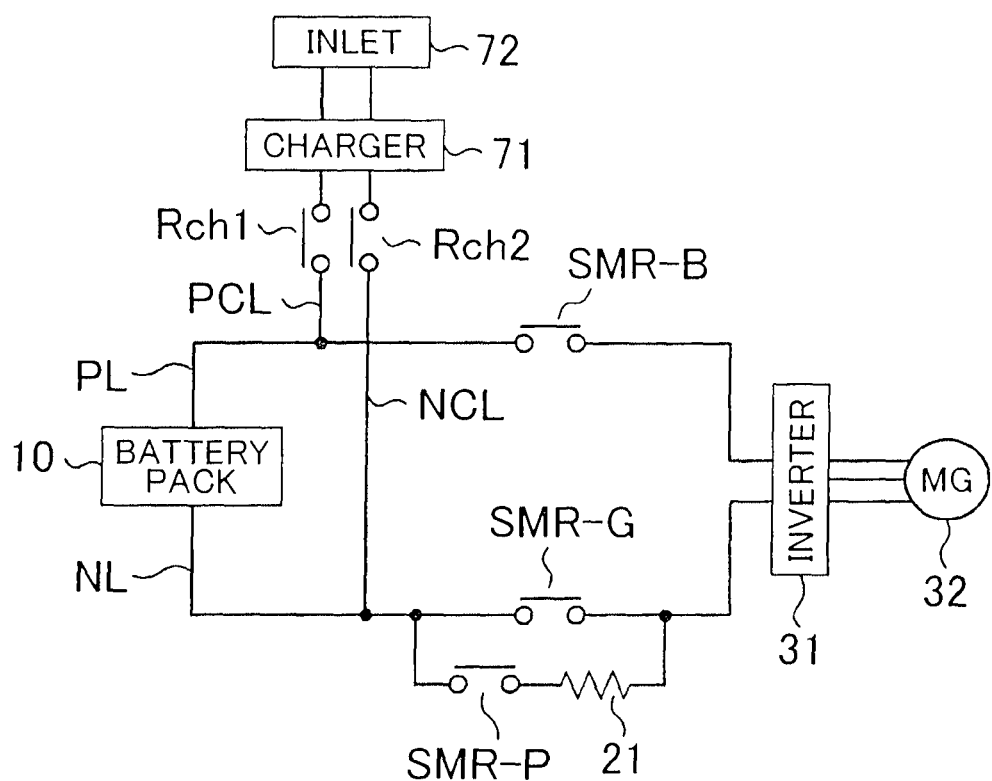
FIG. 2 is a diagram showing a configuration of the battery system with a charger according to Embodiment 1.

As shown in FIG. 2, the charger 71 is connected to the electrode lines PL and NL by charging lines PCL and NCL. Specifically, the charging line PCL is connected to the positive electrode line PL between the battery pack 10 and the system main relay SMR-B, and the charging line NCL is connected to the negative electrode line NL between the battery pack 10 and the system main relay SMR-G.

The charging lines PCL and NCL are provided with charging relays Rch1 and Rch2 respectively. The charging relays Rch1 and Rch2 are switched ON and OFF in response to control signals from the controller 60. An inlet (so-called connector) 71 is connected to the charger 71. A plug (so-called connector, not shown) connected to the commercial power supply is connected to the inlet 72. The external charging can be executed by operating the charger 71 while having the plug connected to the inlet 72. In such a case, the external charging can be executed by turning the charging relays Rch1 and Rch2 ON.

The three system main relays SMR-B, SMR-G, and SMR-P are used in this embodiment, but the system main relay SMR-P can be omitted. In case of omitting the system main relay SMR-P, the resistance element 21 is omitted as well. In this case, the capacitor 22 can be charged prior to switching the system main relays SMR-B and SMR-G from the OFF-states to the ON-states using a power supply different from the battery pack 10 (e.g., a conventional auxiliary battery mounted in the vehicle).

Next is described a circuit for driving the system main relays SMR-B, SMR-G, and SMR-P. A circuit for driving the charging relays Rch1 and Rch2 shown in FIG. 2 is the same as the circuit for driving the system main relays SMR-B, SMR-G, and SMR-P; thus, the detailed description thereof is omitted.

Figure 3:
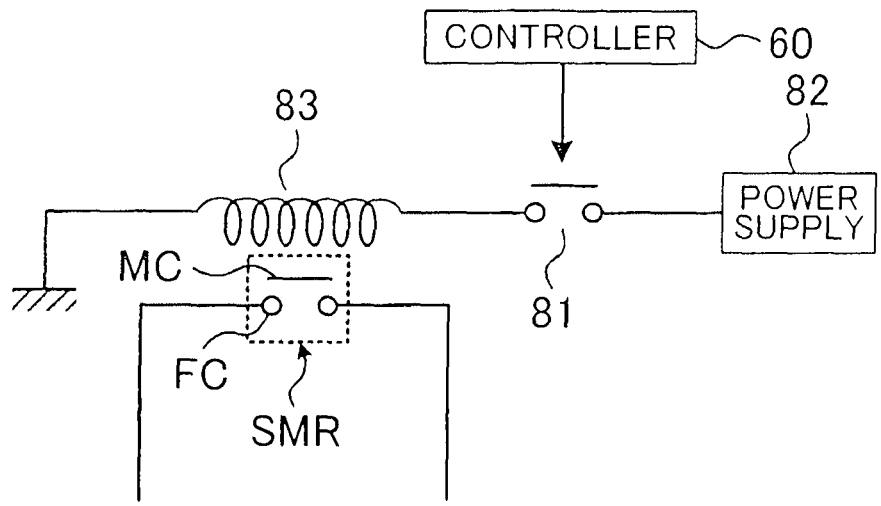
FIG. 3 is a diagram showing a configuration of a circuit driving s system main relay according to Embodiment 1.
Figure 4:
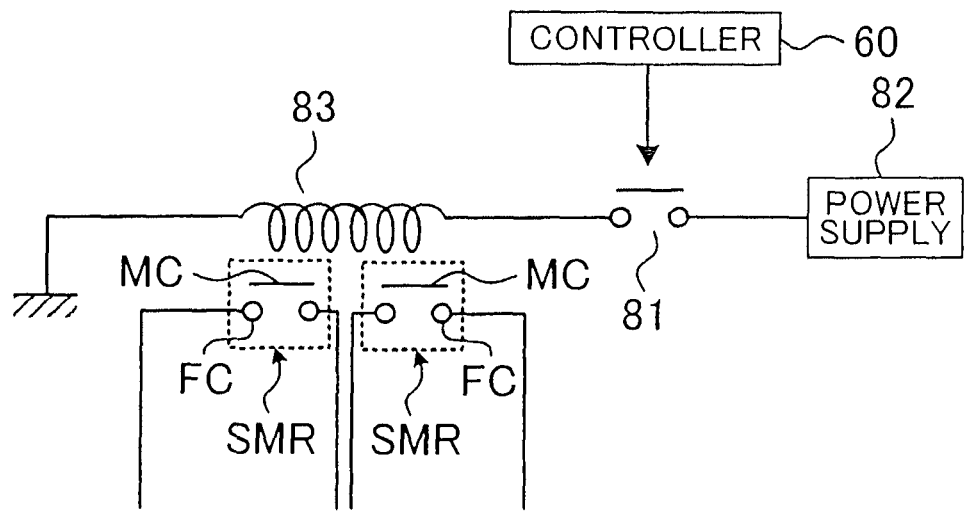
FIG. 4 is a diagram showing another configuration of the circuit driving the system main relay according to Embodiment 1.

The configuration shown in FIG. 3 or 4 can be used as the circuit for driving the system main relays SMR-B, SMR-G, and SMR-P. The system main relays SMR shown in FIGS. 3 and 4 represent any of the system main relays SMR-B, SMR-G, and SMR-P. The system main relays SMR each have a movable contact point MC and a fixed contact point FC.

When the system main relay SMR is OFF, the movable contact point MC is separated from the fixed contact point FC due to the biasing force of a biasing member (not shown). When the controller 60 switches a switch element 81 from its OFF-state to the ON-state, a current flows from a power supply 82 to a coil 83, creating an electromagnetic force. This electromagnetic force brings the movable contact point MC into contact with the fixed contact point FC against the basing force of the basing member. As a result, the system main relay SMR is turned ON. The auxiliary battery described above, for example, or the battery pack 10 can be used as the power supply 82.

The configuration in FIG. 3 shows that each of the system main relays SMR-B, SMR-G, and SMR-P is provided with the coil 83. Electrification and non-electrification of each coil 83 can operate the corresponding system main relay SMR-B, SMR-G, SMR-P independently. In the configuration shown in FIG. 4, one coil 83 is provided per pair of system main relays SMR. Electrification and non-electrification of the coil 83 can operate the two system main relays SMR.

In the configuration shown in FIG. 4, the movable contact points MC of the two system main relays SMR are mechanically connected, so these two movable contact points MC can integrally be moved. The pair of system main relays SMR here is a pair of the system main relay SMR-B (same as the first relay in this invention) and the system main relay SMR-G (same as the second relay in this invention) or a pair of the system main relay SMR-B (same as the first relay in this invention) and the system main relay SMR-P (same as the second relay in this invention).

When operating the system main relays SMR-B and SMR-G using a single coil 83, the system main relay SMR-P can be operated using the configuration shown in FIG. 3. When operating the system main relays SMR-B and SMR-P using a single coil 83, the system main relay SMR-G can be operated using the configuration shown in FIG. 3.

In the configuration shown in FIG. 4, two system main relays SMR can be operated using a single coil 83. This means that the configuration shown in FIG. 4 needs less coils 83 and lower power to be consumed by the coils 83, compared to the configuration shown in FIG. 3.

The configuration of the leak detection circuit 40 is described next with reference to FIG. 5.

The leak detection circuit 40 has an AC power supply 41, a resistance element 42, a coupling capacitor 43, and a voltage sensor 44. The AC power supply 41 is grounded and outputs an AC signal of a predetermined frequency. The resistance element 42 has its one end connected to the AC power supply 41 and the other end to the coupling capacitor 43.

One end of the voltage sensor 44 is connected to the connected point between the resistance element 42 and the coupling capacitor 43. The other end of the voltage sensor 44 is grounded. The voltage sensor 44 detects a voltage value $V_d$ and outputs the result of the detection to the controller 60. When the system main relays SMR-B, SMR-G, and SMR-P shown in FIG. 1 are OFF, the voltage value $V_d$ is the value obtained by dividing a reference voltage value $V_0$ of the AC power supply 41 by a reference resistance value $R_d$ of the resistance element 42 and the resistance value $R_{IB}$ of the insulation resistor 51.

Figure 6:
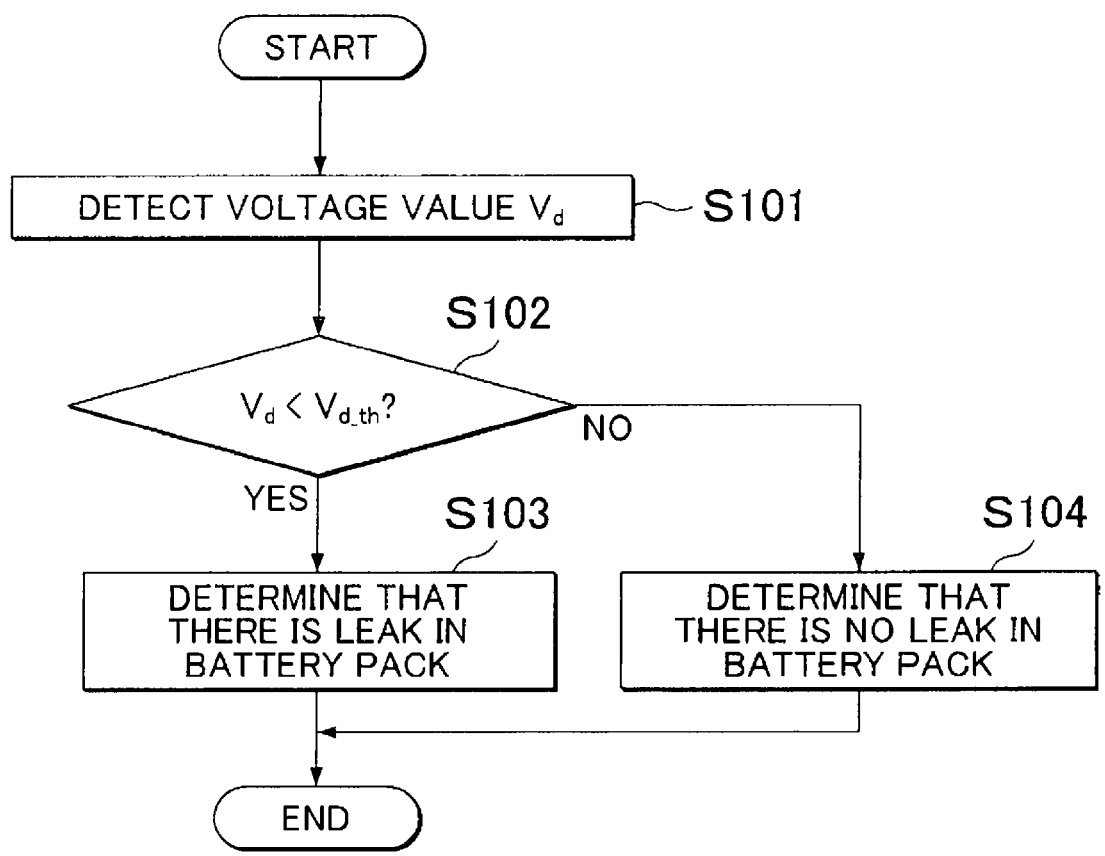
FIG. 6 is a flowchart showing a process for determining the presence of a leak in a battery pack in Embodiment 1.

A process for determining the presence of a leak in the battery pack 10 by using the leak detection circuit 40 is described next using the flowchart shown in FIG. 6. The process shown in FIG. 6 is executed by the controller 60.

In step S101, the controller 60 detects a voltage value $V_d$ based on an output signal from the leak detection circuit 40 (the voltage sensor 44). At this moment, the leak detection circuit 40 has already output an AC signal of a predetermined frequency. In step S102 the controller 60 determines whether or not the voltage value $V_d$ detected in step S101 is lower than a voltage value $V_{d\_th}$.

This voltage value $V_{d\_th}$ is a voltage value $V_d$ that is detected by the voltage sensor 44 when all of the system main relays SMR-B, SMR-G, and SMR-P are not fixed but OFF and there is no leak in the battery pack 10. The voltage value $V_{d\_th}$ can be specified in advance, and information for specifying the voltage value $V_{d\_th}$ can be stored in the memory 61.

When the voltage value $V_d$ is lower than the voltage value $V_{d\_th}$, the controller 60 determines in step S103 that there is a leak in the battery pack 10. However, when the voltage value $V_d$ is equal to or higher than the voltage value $V_{d\_th}$, the controller 60 determines in step S104 that there is no leak in the battery pack 10.

Because the reference resistance value $R_d$ of the resistance element 42 is a preset fixed value, a change in the resistance value $R_{IB}$ of the insulation resistor 51 causes a change in the voltage value $V_d$. In this case, the voltage value $V_d$ that is obtained when the resistance value $R_{IB}$ of the insulation resistor 51 drops due to a leak in the battery pack 10 becomes lower than the voltage value $V_d$ that is obtained when there is no leak in the battery pack 10 (i.e., the voltage value $V_{d\_th}$). Therefore, it can be determined that there is a leak in the battery pack 10 by confirming that the voltage value $V_d$ is lower than the voltage value $V_{d\_th}$. In other words, the absence of a leak in the battery pack 10 can be determined by confirming that the voltage value $V_d$ is equal to or higher than the voltage value $V_{d\_th}$.

Figure 7:
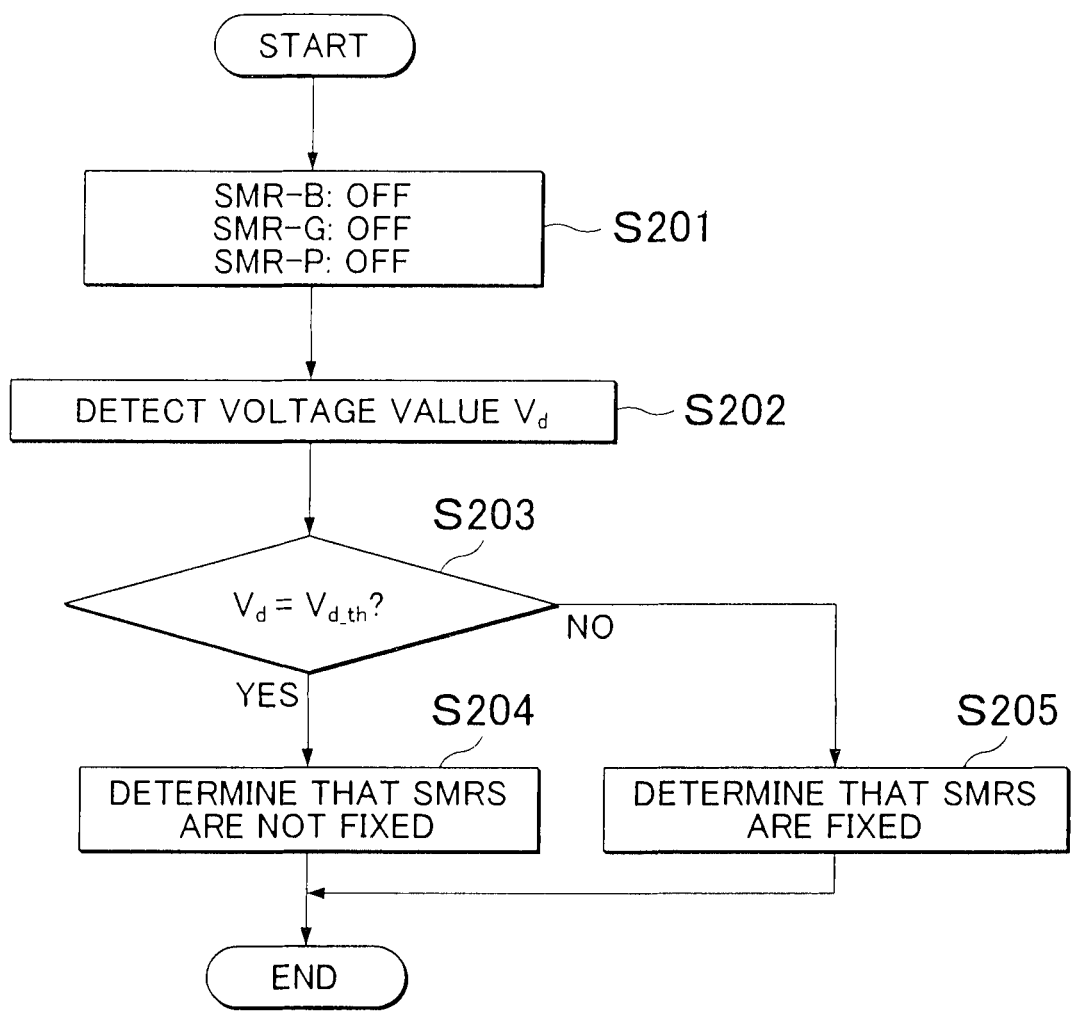
FIG. 7 is a flowchart showing a process for determining whether the system main relay is fixed or not in Embodiment 1.

In this embodiment, however, whether or not the system main relays SMR-B, SMR-G, and SMR-P are fixed is determined by using the leak detection circuit 40. This determination process is described with reference to the flowchart shown in FIG. 7. The process shown in FIG. 7 is executed by the controller 60. Upon execution of the process shown in FIG. 7, the controller 60 can be operated with a supply of power from a power source different from the battery pack 10 (e.g. the auxiliary battery mounted in the vehicle).

The process shown in FIG. 7 can be executed after, for example, it is determined that there is no leak in the battery pack 10. When there is a leak in the battery pack 10 the resistance value $R_{IB}$ of the insulation resistor 51 drops, changing the voltage value $V_d$, as described above. When it is determined based on this voltage value $V_d$ that the system main relays SMR-B, SMR-G, and SMR-P are fixed, a false determination can be made, as described hereinafter. Therefore, it is preferred that the absence of a leak in the battery pack 10 be confirmed prior to determining whether the system main relays SMR-B, SMR-G, and SMR-P are fixed or not.

In step S201, the controller 60 outputs a control signal for turning the system main relays SMR-B, SMR-G, and SMR-P OFF. When the system main relays SMR-B, SMR-G, and SMR-P are not fixed but normal, the system main relays SMR-B, SMR-G, and SMR-P are turned OFF in response to the control signal from the controller 60. Because the system main relays SMR-B, SMR-G, and SMR-P are OFF in the stopped state of the battery system shown in FIG. 1 as described above, the steps subsequent to step S202 can be executed in the stopped state of the battery system.

In step S202, the controller 60 detects a voltage value $V_d$ based on an output signal from the leak detection circuit 40 (the voltage sensor 44). At this moment, the leak detection circuit 40 has already output an AC signal of a predetermined frequency. In step S203 the controller 60 determines whether or not the voltage value $V_d$ detected in step S202 is equal to the abovementioned voltage value $V_{d\_th}$.

When the voltage value $V_d$ detected in step S202 is equal to the voltage value $V_{d\_th}$, the controller 60 determines in step S204 that the system main relays SMR-B, SMR-G, and SMR-P are not fixed. However, when the voltage value $V_d$ detected in step S202 is different from the voltage value $V_{d\_th}$, the controller 60 determines in step S205 that any of the system main relays SMR-B, SMR-G, and SMR-P is fixed.

If any of the system main relays SMR-B, SMR-G, and SMR-P is fixed, the AC signal output from the leak detection circuit 40 flows to the electrical apparatus 30 through the fixed system main relay SMR. In this case, a value that is obtained by dividing the reference voltage value $V_0$ by a combined resistance value of the resistance value $R_{IB}$ of the insulation resistor 51 and the resistance value $R_{IL}$ of the insulation resistor 52 and the reference resistance value $R_d$ of the resistance element 42 is detected as the voltage value $V_d$. The resistance values $R_{IB}$ and $R_{IL}$ are resistance values obtained when there is no leak in the battery pack 10.

Because the resistance value $R_{IL}$ is lower than the resistance value $R_{IB}$ as described above, the combined resistance value of the resistance values $R_{IB}$ and $R_{IL}$ is lower than each of the resistance values $R_{IB}$ and $R_{IL}$, and the voltage value $V_d$ becomes different from the voltage value $V_{d\_th}$. Specifically, the voltage value $V_d$ becomes lower than the voltage value $V_{d\_th}$. Therefore, when the voltage value $V_d$ is different from the voltage value $V_{d\_th}$, it can be determined that any of the system main relays SMR-B, SMR-G, and SMR-P is fixed.

As described with reference to FIG. 6, when the resistance value $R_{IB}$ of the insulation resistor 51 drops, it can be determined that there is a leak in the battery pack 10. In other words, even when the resistance value $R_{IB}$ does not become lower than the resistance value $R_{IL}$ when there is a leak in the battery pack 10 it can still be determined that there is a leak in the battery pack 10 as long as this resistance value $R_{IB}$ is lower than the resistance value $R_{IB}$ obtained when there is no leak in the battery pack 10. When, on the other hand, any of the system main relays SMR-B, SMR-G, and SMR-P is fixed, the combined resistance value of the resistance values $R_{IB}$ and $R_{IL}$ becomes lower than each of the resistance values $R_{IB}$ and $R_{IL}$, as described above. Therefore, the voltage value $V_d$ that is detected when there is a leak in the battery pack 10 is likely to be different from the voltage value $V_d$ that is detected when any of the system main relays SMR-B, SMR-G, and SMR-P is fixed.

Whether or not the voltage value $V_d$ is equal to the voltage value $V_{d\_th}$ is determined in step S203 shown in FIG. 7; however, the method for this determination is not limited thereto. Specifically, whether or not the voltage value $V_d$ falls within a predetermined range based on the voltage value $V_{d\_th}$ may be determined in consideration of a detection error of the voltage sensor 44. In other words, the controller 60 can determine whether or not the voltage value $V_d$ satisfies the condition expressed in the following formula (1).

$$V_{d\_th} - \alpha \leq V_d \leq V_{d\_th} + \alpha \quad (1)$$

The constant $\alpha$ in the formula (1) represents a value permitting fluctuations in the voltage value $V_d$ and is equal to or higher than 0. The constant $\alpha$ can be set as appropriate based on the judgment that the voltage value $V_d$ is equal to the voltage value $V_{d\_th}$. In this invention, the fact that the voltage value $V_d$ is equal to the voltage value $V_{d\_th}$ also means that the condition expressed in the formula (1) above is satisfied.

When the voltage value $V_d$ satisfies the condition expressed in the formula (1), the controller 60 can determine in step S204 that the system main relays SMR-B, SMR-G, and SMR-P are not fixed. When the voltage value $V_d$ does not satisfy the condition expressed in the formula (1), the controller 60 can determine in step S205 that any of the system main relays SMR-B, SMR-G, and SMR-P is fixed.

When it is determined that any of the system main relays SMR-B, SMR-G, and SMR-P is fixed, the controller 60 can warn a user or the like. Any conventional means can be employed, as appropriate, as means for warning the user or the like. For example, warning sound can be output or information describing a warning can be displayed on a display. This can allow a dealer, a contractor or the like to inspect the system main relays SMR-B, SMR-G, and SMR-P. A warning can also be sent to the user or the like when it is determined that there is a leak in the battery pack 10.

In the process shown in FIG. 7, a voltage value $V_d$ is detected in step S202 and it is determined in step S203 whether or not the voltage value $V_d$ is equal to the voltage value $V_{d\_th}$; however, the methods for detecting the voltage value $V_d$ and for determining whether the voltage value $V_d$ is equal to the voltage value $V_{d\_th}$ or not are not limited thereto. Specifically, both the detection of the voltage value $V_d$ and the calculation of a resistance value $R_I$ (same as the calculated resistance value of this invention) based on the detected voltage value $V_d$ can be executed in step S202. The resistance value $R_I$ can be calculated from, for example, the following formula (2).

$$V_d = \frac{R_I}{R_d + R_I} \cdot V_0 \quad (2)$$

According to this formula (2), the voltage value $V_d$ is the value obtained by dividing the reference voltage value $V_0$ by the resistance value $R_I$ and the reference resistance value $R_d$. If there is no leak in the battery pack 10 and the system main relays SMR-B, SMR-G, and SMR-P are OFF, the calculated resistance value $R_I$ represents a combined resistance value $R_{c1}$ that is calculated from the resistance values of the insulation resistances in the system main relays SMR-B, SMR-G, and SMR-P and the resistance value $R_{IB}$ of the insulation resistor 51 obtained when there is no leak in the battery pack 10. The insulation resistances in the system main relays SMR-B, SMR-G, and SMR-P are each an insulation resistance detected between the movable contact point MC and the fixed contact point FC, the resistance value of which is equal to the resistance value $R_{IB}$ of the insulation resistor 51.

When the calculated resistance value $R_I$ is equal to the combined resistance value $R_{c1}$, it can be determined that the system main relays SMR-B, SMR-G, and SMR-P are not fixed but OFF. The fact that the resistance value $R_I$ is equal to the combined resistance value $R_{c1}$ means that the voltage value $V_d$ is equal to the voltage value $V_{d\_th}$.

The combined resistance value $R_{c1}$ can be obtained beforehand, and the information indicating the combined resistance value $R_{c1}$ can be stored in the memory 61. Note that the combined resistance value $R_{c1}$ can be considered as the resistance value $R_{IB}$ as well. In other words, when the calculated resistance value $R_I$ is the resistance value $R_{IB}$, it can be determined that the system main relays SMR-B, SMR-G, and SMR-P are not fixed but OFF.

When the resistance value $R_I$ falls within a predetermined range based on the combined resistance value $R_{c1}$ or the resistance value $R_{IB}$, it can be determined, in consideration of the accuracy of calculating the resistance value $R_I$, that the system main relays SMR-B, SMR-G, and SMR-P are not fixed. In other words, it can be determined whether or not the resistance value $R_I$ falls within the predetermined range based on the combined resistance value $R_{c1}$ or resistance value $R_{IB}$, as in the condition expressed in the formula (1).

When, on the other hand, any of the system main relays SMR-B, SMR-G, and SMR-P is fixed, the AC signal of the leak detection circuit 40 flows to the electrical apparatus 30 as well, as described above. In such a case, the calculated resistance value $R_I$ becomes a combined resistance value $R_{c2}$ of the resistance value $R_{IB}$ of the insulation resistor 51 and the resistance value $R_{IL}$ of the insulation resistor 52. These resistance values $R_{IB}$ and $R_{IL}$ are obtained when there is no leak in the battery pack 10.

Since the resistance value $R_{IL}$ is lower than the resistance value $R_{IB}$, the combined resistance value $R_{c2}$ of the resistance values $R_{IB}$ and $R_{IL}$ is different from the combined resistance value $R_{c1}$ described above. Thus, when the calculated resistance value $R_I$ is different from the combined resistance value $R_{c1}$, it can be determined that any of the system main relays SMR-B, SMR-G, and SMR-P is fixed. The fact that the resistance value $R_I$ is different from the combined resistance value $R_{c1}$ also means that the voltage value $V_d$ is different from the voltage value $V_{d\_th}$.

Not only the insulation resistors 51 and 52 but also a stray capacitance are generated between the battery pack 10 and the electrical apparatus 30. With a circuit configuration in which a stray capacitance can be neglected, it can be determined whether or not the system main relays SMR-B, SMR-G, and SMR-P are fixed, by calculating the resistance value $R_I$ as described above.

This embodiment can determine whether any of the system main relays SMR (SMR-B, SMR-G, and SMR-P) is fixed or not, while continuing the control for turning the system main relays SMR OFF. Conventionally (in the related art), however, the system main relays SMR are turned ON and OFF in order to determine whether or not any of the system main relays SMR is fixed, as described above. However, the system main relays SMR do not have to be turned ON and OFF in this embodiment.

In this embodiment, determining the fixation of the system main relays SMR without turning the system main relays SMR ON and OFF can reduce the number of times the movable contact points MC come into contact with the fixed contact points FC, preventing wear of the movable contact points MC and the fixed contact points FC. This can extend the duration of continuous use of the system main relays SMR.

In this embodiment, as described above, the voltage values $V_d$ detected by the voltage sensor 44 differ depending on when the two system main relays SMR (SMR-B and SMR-G or SMR-B and SMR-P) provided on the electrode lines PL and NL are OFF and when one of the system main relays SMR is fixed while the other one is OFF. This enables distinction, based on the detected voltage values $V_d$, between the situation where the two system main relays SMR are OFF and the situation where one of the system main relays SMR is fixed while the other one is OFF. In other words, this embodiment can determine whether or not at least one of the system main relays SMR is fixed by monitoring the detected voltage value $V_d$.

Note that whether or not the two system main relays SMR are fixed can be determined by using the result of the detection by the voltage sensor 23 shown in FIG. 1. When both of the system main relays SMR-B and SMR-G are fixed or when both of the system main relays SMR-B and SMR-P are fixed, the capacitor 22 shown in FIG. 1 is charged, and the voltage value detected by the voltage sensor 23 indicates the voltage value of the battery pack 10. In other words, the voltage value detected by the voltage sensor 23 is higher than 0 [V]. Thus, whether or not the two system main relays SMR are fixed can be determined based on the voltage value detected by the voltage sensor 23.

However, in the configuration shown in FIG. 4 where the two system main relays SMR are simultaneously operated, the use of the result of the detection by the voltage sensor 23 does not necessarily enable determination of whether or not one of the two system main relays SMR is fixed. In other words, the result of the detection by the voltage sensor 23 that is obtained when the two system main relays SMR are OFF is the same as the result of the detection by the voltage sensor 23 that is obtained when one of the system main relays SMR is fixed while the other one is OFF.

This means that the use of the result of the detection by the voltage sensor 23 does not realize distinction between the situation where the two system main relays SMR are OFF and the situation where one of the system main relays SMR is fixed while the other one is OFF. In other words, the use of the result of the detection by the voltage sensor 23 cannot specify the fact that one of the system main relays SMR is fixed.

Even if the positive electrode line PL or the negative electrode line NL is provided with a current sensor, a result of detection by the current sensor is not enough to distinguish between the situation where the two system main relays SMR are OFF and the situation where one of the system main relays SMR is fixed while the other one is OFF.

This embodiment, however, can not only determine whether or not the system main relays SMR are fixed, but also determine whether or not the charging relays Rch1 and Rch2 shown in FIG. 2 are fixed.

When determining whether the charging relays Rch1 and Rch2 are fixed or not in the configuration shown in FIG. 2, control for turning the system main relays SMR-B, SMR-G, and SMR-P OFF and control for turning the charging relays Rch1 and Rch2 OFF are executed. When determining whether the charging relays Rch1 and Rch2 are fixed or not, it is preferred to make sure beforehand that the system main relays SMR-B, SMR-G, and SMR-P are not fixed.

If neither of the charging relays Rch1 and Rch2 is fixed in the configuration shown in FIG. 2, the voltage value $V_d$ becomes equal to the voltage value $V_{d\_th}$, as is the case described with reference to the process shown in FIG. 7. At this moment, the resistance values of the insulation resistances in these OFF charging relays Rch1 and Rch2 (the insulation resistances between the movable contact points and the fixed contact points) are equal to the resistance value $R_{IB}$ of the insulation resistor 51. Therefore, whether the charging relays Rch1 and Rch2 are fixed or not can be determined by making sure that the voltage value $V_d$ is equal to the voltage value $V_{d\_th}$. The fact that the voltage value $V_d$ is equal to the voltage value $V_{d\_th}$ includes the condition expressed in the formula (1).

However, if at least either one of the charging relays Rch1 and Rch2 is fixed, the voltage value $V_d$ differs from the voltage value $V_{d\_th}$, as is the case described with reference to the process shown in FIG. 7. Therefore, whether at least either one of the charging relays Rch1 and Rch2 is fixed or not can be determined by making sure that the voltage value $V_d$ is different from the voltage value $V_{d\_th}$. The relays described in this invention include the system main relays SMR-B, SMR-G, and SMR-P and the charging relays Rch1 and Rch2.

Embodiment 2 of the invention is now described. In this embodiment, the same components as those described in Embodiment 1 are denoted the same reference numerals, and detailed descriptions thereof are omitted accordingly. The differences with Embodiment 1 are mainly described below.

The voltage value $V_d$ can be expressed in the following formula (3).

$$V_d = V_0 \sqrt{\frac{\left(\frac{R_s}{1+(\omega_d R_s C_s)^2}\right)^2 + \left(\frac{1}{\omega_d C_d} + \frac{\omega_d R_s^2 C_s}{1+(\omega_d R_s C_s)^2}\right)^2}{\left(R_d + \frac{R_s}{1+(\omega_d R_s C_s)^2}\right)^2 + \left(\frac{1}{\omega_d C_d} + \frac{\omega_d R_s^2 C_s}{1+(\omega_d R_s C_s)^2}\right)^2}} \quad (3)$$

Figure 5:
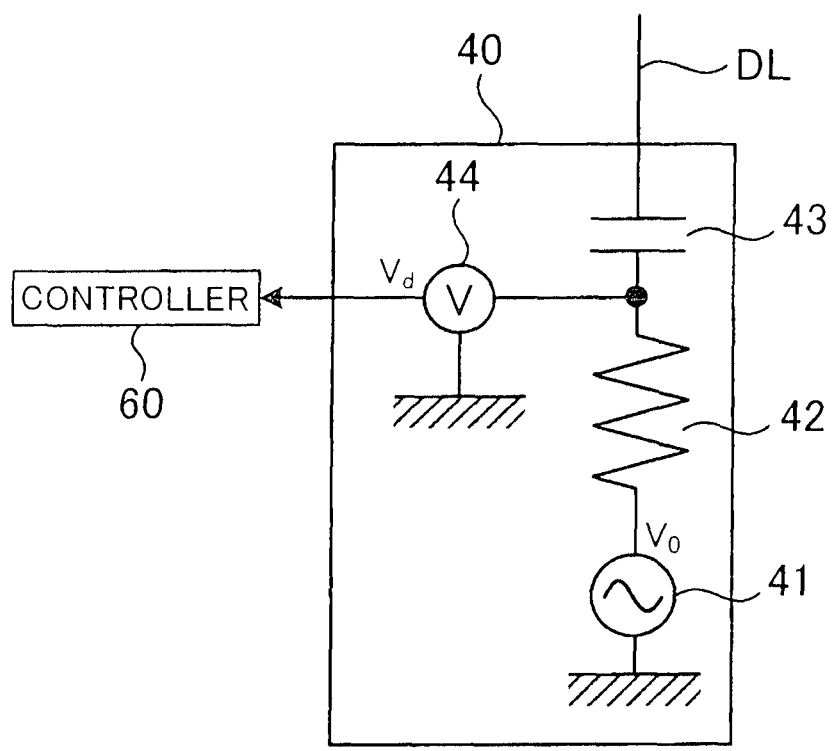
FIG. 5 is a diagram showing a configuration of a leak detection circuit according to Embodiment 1.

In the formula (3) above, $C_s$ represents a stray capacitance generated between the battery pack 10 or electrical apparatus 30 and the vehicle body, and $C_d$ a static capacitance of the coupling capacitor 43 (see FIG. 5). The term $R_d$ represents the reference resistance value of the resistance element 42 (see FIG. 5), and $R_s$ the resistance value of the insulation resistance generated between the battery pack 10 or electrical apparatus 30 and the vehicle body. The term $V_0$ is the reference voltage value of the AC power supply 41, and $\omega_d$ an angular velocity ($\omega_d = 2\pi \times f_d$). The term $f_d$ represents the frequency of an AC signal from the AC power supply 41.

Figure 8:
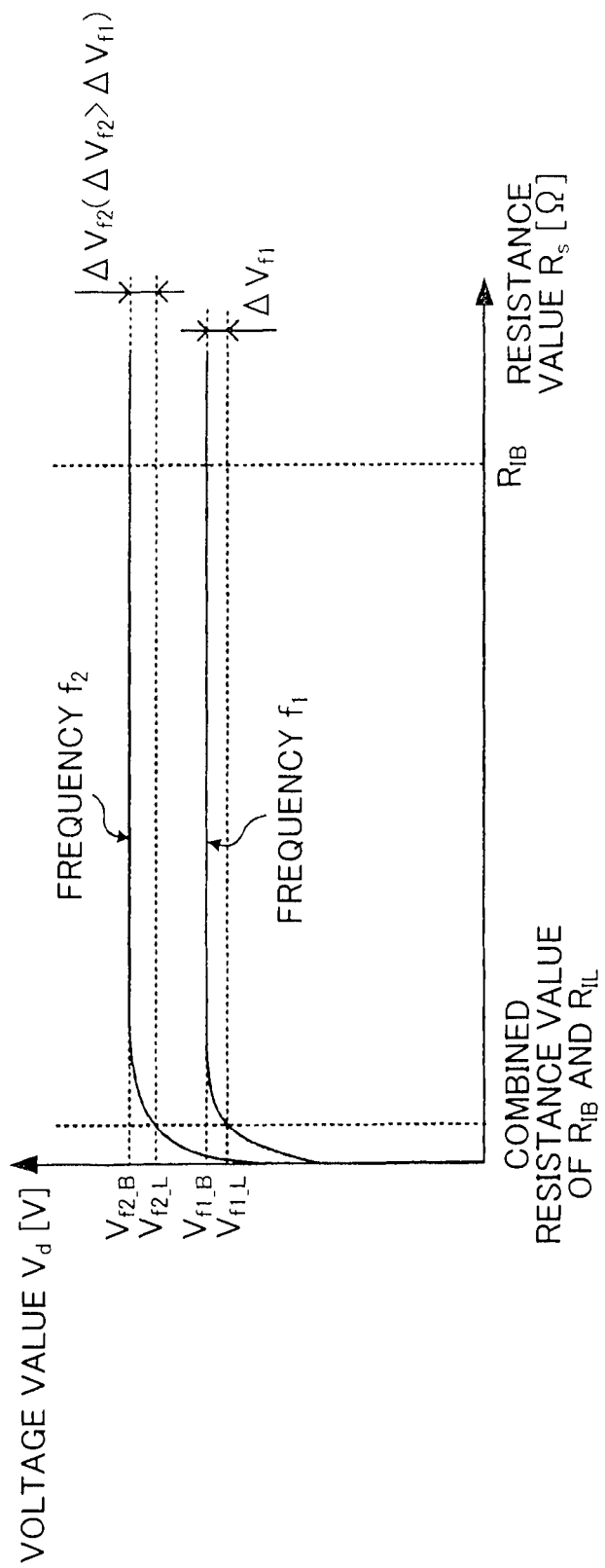
FIG. 8 is a diagram showing how the relationship between a voltage value $V_d$ and a resistance value (insulation resistance) $R_s$ changes in response to the frequencies of AC signals in Embodiment 2.

According to this formula (3), a change in the angular velocity $\omega_d$ (i.e., the frequency $f_d$) causes a change in the voltage value $V_d$. FIG. 8 shows the relationship between the voltage value $V_d$ and the resistance value $R_s$ of the insulation resistance, the relationship being obtained when the frequency $f_d$ is set at frequencies $f_1$ and $f_2$. In FIG. 8, the vertical axis shows the voltage value $V_d$ detected by the voltage sensor 44, while the horizontal axis shows the resistance value $R_s$ of the insulation resistance. FIG. 8 shows the relationship between the voltage value $V_d$ and the resistance value $R_s$ when the system main relays SMR-B, SMR-G, and SMR-P are not fixed.

The frequency $f_1$ is higher than the frequency $f_2$. When the AC signal with the frequency $f_1$ is used in the leak detection circuit 40, the voltage value $V_d$ obtained when the resistance value $R_s$ represents the resistance value $R_{IB}$ becomes a voltage value $V_{f1\_B}$. In other words, when there is no leak in the battery pack 10 and none of the system main relays SMR-B, SMR-G, and SMR-P is fixed, the voltage value $V_d$ reaches the voltage value $V_{f1\_B}$ and stays constant, as shown in FIG. 8.

When the AC signal with the frequency $f_1$ is used, the voltage value $V_d$ that is obtained when the resistance value $R_s$ represents the combined resistance value of the resistance values $R_{IB}$ and $R_{IL}$ becomes a voltage value $V_{f1\_L}$. In other words, when there is no leak in the battery pack 10 and at least one of the system main relays SMR-B, SMR-G, and SMR-P is fixed, the voltage value $V_d$ does not increase to the voltage value $V_{f1\_B}$ but reaches voltage value $V_{f1\_L}$ and stays constant. The difference between the voltage values $V_{f1\_B}$ and $V_{f1\_L}$ is $\Delta V_{f1}$.

As a result, whether or not at least one of the system main relays SMR-B, SMR-G, and SMR-P is fixed can be determined by determining which one of the voltage values, $V_{f1\_B}$ and $V_{f1\_L}$, the voltage value $V_d$ represents. In other words, by making sure that the voltage value $V_d$ represents the voltage value $V_{f1\_L}$, it can be determined that at least one of the system main relays SMR-B, SMR-G, and SMR-P is fixed.

When the AC signal with the frequency $f_2$ is used in the leak detection circuit 40, the voltage value $V_d$ that is obtained when the resistance value $R_s$ represents the resistance value $R_{IB}$ becomes a voltage value $V_{f2\_B}$. In other words, when there is no leak in the battery pack 10 and none of the system main relays SMR-B, SMR-G, and SMR-P is fixed, the voltage value $V_d$ reaches the voltage value $V_{f2\_B}$ and stays constant, as shown in FIG. 8.

Further, when the AC signal with the frequency $f_2$ is used, the voltage value $V_d$ that is obtained when the resistance value $R_s$ represents the combined resistance value of the resistance values $R_{IB}$ and $R_{IL}$ becomes a voltage value $V_{f2\_L}$. In other words, when there is no leak in the battery pack 10 and at least one of the system main relays SMR-B, SMR-G, and SMR-P is fixed, the voltage value $V_d$ does not increase to the voltage value $V_{f2\_B}$ but reaches the voltage value $V_{f2\_L}$ and stays constant. The difference between the voltage values $V_{f2\_B}$ and $V_{f2\_L}$ is $\Delta V_{f2}$.

As a result, whether or not at least one of the system main relays SMR-B, SMR-G, and SMR-P is fixed can be determined by determining which of the voltage values, $V_{f2\_B}$ and $V_{f2\_L}$, the voltage value $V_d$ represents. In other words, by making sure that the voltage value $V_d$ represents the voltage value $V_{f2\_L}$, it can be determined that at least one of the system main relays SMR-B, SMR-G, and SMR-P is fixed.

The larger the voltage difference $\Delta V$ is, the easier it is to determine whether at least one of the system main relays SMR-B, SMR-G, and SMR-P is fixed or not, based on the voltage values $V_d$ detected by the voltage sensor 44 of the leak detection circuit 40. Because the voltage difference $\Delta V_{f2}$ is larger than the voltage difference $\Delta V_{f1}$ as shown in FIG. 8, whether or not at least one of the system main relays is fixed can be determined more easily by using the AC signal with the frequency $f_2$ than the AC signal with the frequency $f_1$. Since the lower the frequency $f_d$, the larger the voltage difference $\Delta V$ becomes, it is preferred that the frequency $f_d$ be lowered in order to determine whether at least one of the system main relays is fixed or not.

However, the lower the frequency $f_d$, the longer it takes to determine the presence of a leak in the battery pack 10. As described in Embodiment 1, whether or not there is a leak in the battery pack 10 is determined based on the voltage value $V_d$. The lower the frequency $f_d$ is, the longer it takes for the voltage value $V_d$ to stop changing (i.e., the longer it takes to specify the voltage value $V_d$), increasing the time it takes to determine whether or not there is a leak in the battery pack 10.

As a way of coping with it, the frequency $f_d$ used for determining the presence of a leak in the battery pack 10 can be made different from the frequency $f_d$ used for determining whether any of the system main relays SMR is fixed or not. Specifically, the frequency $f_1$ is used as the frequency $f_d$ when determining the presence of a leak in the battery pack 10 and the frequency $f_2$ is used as the frequency $f_d$ when determining whether any of the system main relays SMR is fixed or not.

The time it takes for the voltage value $V_d$ to stay constant can be reduced by using the AC signal with the frequency $f_1$ rather than using the AC signal with the frequency $f_2$, thus resulting in a reduction of time it takes to determine whether or not there is a leak in the battery pack 10. On the other hand, the voltage difference $\Delta V$ can be increased by using the AC signal with the frequency $f_2$ rather than using the AC signal with the frequency $f_1$, thus facilitating the determination of whether or not any of the system main relays SMR is fixed based on the voltage value $V_d$.

Figure 9:
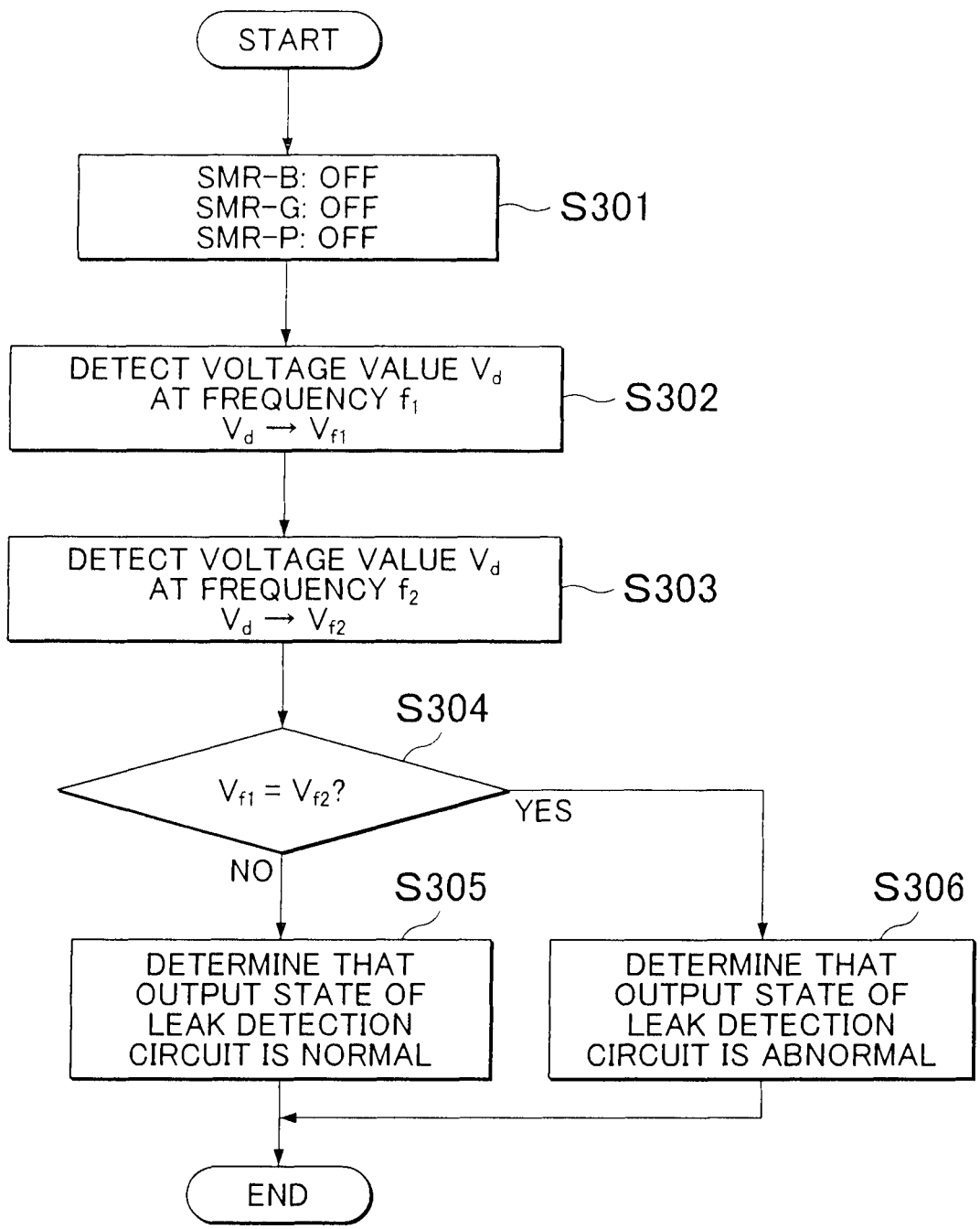
FIG. 9 is a flowchart showing a process for determining whether or not the output state of the AC signal from the leak detection circuit is normal in Embodiment 2.

When changing the frequency $f_d$ in order to determine the presence of a leak in the battery pack 10 and to determine the fixation of any of the system main relays SMR , it is necessary to determine whether or not a normal frequency $f_d$ is set. The process for determining whether or not the normal frequency $f_d$ is set is described with reference to the flowchart shown in FIG. 9. The process shown in FIG. 9 is executed by the controller 60.

Step S301 is the same as step S201 shown in FIG. 7. In step S302 the controller 60 causes the leak detection circuit 40 to output the AC signal with the frequency $f_1$ and detects a voltage value $V_d$ based on the output from the voltage sensor 44. The controller 60 then stores the detected voltage value $V_d$ in the memory 61 as a voltage value $V_{f1}$.

In step S303, the controller 60 changes the frequency $f_d$ of the AC signal, which is output from the leak detection circuit 40, from the frequency $f_1$ to the frequency $f_2$, and detects a voltage value $V_d$ based on the output of the voltage sensor 44. The controller 60 then stores the detected voltage value $V_d$ in the memory 61 as a voltage value $V_{f2}$. Although the frequency $f_d$ is changed from the frequency $f_1$ to the frequency $f_2$ in steps S302 and S303, the frequency $f_d$ can be changed from the frequency $f_2$ to the frequency $f_1$ after setting the frequency $f_d$ at the frequency $f_2$. In other words, the voltage values $V_{f1}$ and $V_{f2}$ may be detected in the AC signals with the frequencies $f_1$ and $f_2$.

In step S304, the controller 60 determines whether or not the voltage value $V_{f1}$, which is stored in the memory 61 in step S302, is equal to the voltage $V_{f2}$, which is stored in the memory 61 in step S303. When the voltage values $V_{f1}$ and $V_{f2}$ vary from each other, the controller 60 executes step S305. When the voltage values $V_{f1}$ and $V_{f2}$ are equal to each other, the controller 60 executes step S306.

In view of the fact that the voltage values $V_{f1}$ and $V_{f2}$ fluctuate, step S304 can determine, for example, whether or not the voltage value $V_{f1}$ falls within a predetermined range based on the voltage value $V_{f2}$ and whether or not the voltage value $V_{f2}$ falls within a predetermined range based on the voltage value $V_{f1}$. Specifically, step S306 can be executed when the condition expressed in the following formula (4) or (5) is satisfied, and step S305 can be executed when the condition expressed in the formula (4) or (5) is not satisfied.

$$V_{f2} - \beta \le V_{f1} \le V_{f2} + \beta \quad (4)$$

$$V_{f1} - \gamma \le V_{f2} \le V_{f1} + \gamma \quad (5)$$

The constant $\beta$ shown in the formula (4) and the constant $\gamma$ shown in the formula (5) represent values permitting the fluctuations of the voltage values $V_{f1}$ and $V_{f2}$ and are equal to or higher than 0. The constants $\beta$ and $\gamma$ can be set as appropriate based on the judgment that the voltage values $V_{f1}$ and $V_{f2}$ are equal to each other. In this invention, the fact that the voltage values $V_{f1}$ and $V_{f2}$ are equal to each other also means that the condition expressed in the formula (4) or (5) above is satisfied.

In step S305 the controller 60 determines that the output states of the AC signals from the leak detection circuit 40 are normal. In other words, the controller 60 determines that the frequencies of the AC signals from the leak detection circuit 40 are normal. As described with reference to FIG. 8, when the frequency $f_d$ changes, the voltage values $V_d$ detected based on the frequencies $f_1$ and $f_2$ (e.g., the voltage values $V_{f1\_B}$, $V_{f2\_B}$) vary from each other. In step S304, therefore, it can be determined that the frequencies of the AC signals from the leak detection circuit 40 are normal, by making sure that the voltage values $V_{f1}$ and $V_{f2}$ are different from each other.

In step S306, the controller 60 determines that the output states of the AC signals from the leak detection circuit 40 are abnormal. In other words, the controller 60 determines that the frequencies of the AC signals from the leak detection circuit 40 are abnormal. As described above, if the frequency $f_d$ changes, the voltage values $V_d$ detected based on the frequencies $f_1$ and $f_2$ vary from each other. When the voltage values $V_d$ detected based on the frequencies $f_1$ and $f_2$ are equal to each other, the frequency $f_d$ stays constant, and the leak detection circuit 40 does not output an AC signal of a normal frequency. In step S306, therefore, it is determined that the frequencies of the AC signals from the leak detection circuit 40 are abnormal.

By determining that the output states of the AC signals from the leak detection circuit 40 are normal, whether there is a leak in the battery pack 10 or not and whether any of the system main relays SMR is fixed or not can be determined while switching the frequency $f_d$ between the frequencies $f_1$ and $f_2$. In this embodiment as well, whether the charging relays Rch1 and Rch2 are fixed or not can be determined in the same manner as in Embodiment 1.

Embodiment 3 of the invention is now described. In this embodiment, the same components as those described in Embodiments 1 and 2 are denoted the same reference numerals, and detailed descriptions thereof are omitted accordingly. The differences with Embodiments 1 and 2 are mainly described below.

The methods for determining the fixation of a relay according to Embodiments 1 and 2 determine that a relay is fixed when the voltage value $V_d$ of the voltage sensor 44 of the leak detection circuit 40 is different from the voltage value $V_{d\_th}$ that is obtained when there is no leak in the battery pack 10 (voltage value $V_d$<voltage value $V_{d\_th}$).

However, the circuit elements of the leak detection circuit 40, such as the resistance element 42 and coupling capacitor 43, have individual differences and characteristic differences (differences among the circuits) resulting from changes in temperature. The resistance element 51 representing the insulation resistance between the battery pack 10 and the vehicle body and the resistance element 52 representing the insulation resistance between the electrical apparatus 30 and the vehicle body, too, have individual differences and characteristic differences resulting from changes in temperature, such as those among the battery pack 10 the vehicle, and the electrical apparatus 30.

Because the voltage value $V_d$ changes due to such differences among the circuits, a tolerance (the constant $\alpha$) corresponding to the differences among the circuits can be set for the voltage value $V_{d\_th}$ as in Embodiment 1, but there is a limit to setting the tolerance corresponding to the differences among the circuits when it comes to improving the accuracy of determining the ixation of a relay.

Figure 10:
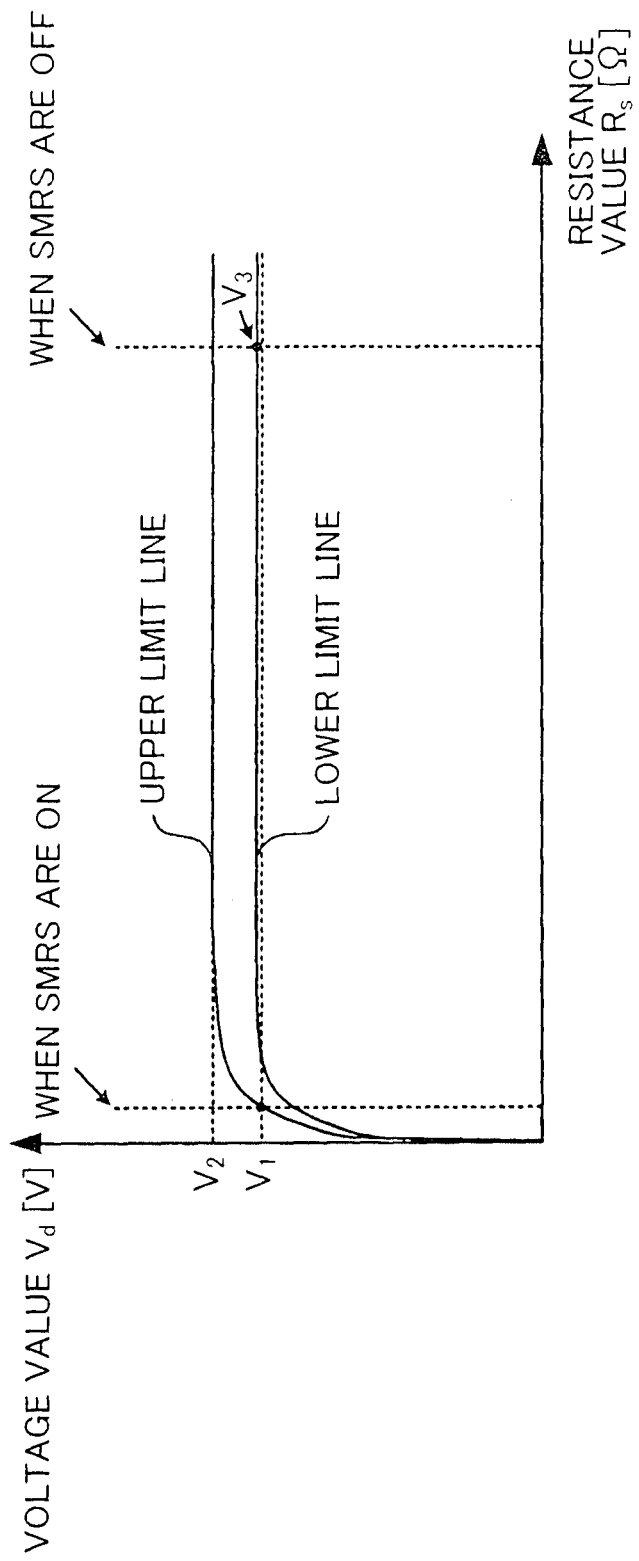
FIG. 10 is a diagram showing how the relationship between the voltage value $V_d$ and the resistance value (insulation resistance) $R_s$ changes due to the differences among the circuits in Embodiment 3.

FIG. 10 is a diagram showing how the relationship between the voltage value $V_d$ and the resistance value (insulation resistance) $R_s$ changes due to the differences among the circuits. As shown in FIG. 10, while the voltage value $V_d$ changes along the lower limit line when, for example, the resistance of a circuit element is low, the voltage value $V_d$ changes along the upper limit line when the resistance of the circuit element is high.

Therefore, when the system main relays SMR are ON, that is, when the system main relays SMR are fixed, the voltage value $V_d$ along the upper limit line becomes a voltage value $V_1$. When the system main relays SMR are OFF, that is, when the system main relays SMR are not fixed, the voltage value $V_d$ along the upper limit line becomes a voltage value $V_2$. This is because, since the resistance value $R_{IB}$ of the resistance element 51 is higher than the resistance value $R_{IL}$, of the resistance element 52, the voltage value $V_1$ that is obtained in the abnormal state where the system main relays SMR are fixed becomes lower than the voltage value $V_2$ that is obtained in the normal state where the system main relays SMR are not fixed. For this reason, the voltage value $V_{d\_th}$ along the upper limit line can be set on premise that there is this voltage difference.

At the voltage value $V_d$ along the lower limit line, however, there is a possibility that the voltage difference between a voltage $V_3$ obtained when the system main relays SMR are OFF and the voltage value $V_1$ along the upper limit line obtained when the system main relays SMR are fixed becomes small or that the voltage value $V_3$ drops below the voltage value $V_1$. In such a case, even the normal state in which the system main relays are not fixed could be determined as the abnormal state in which the system main relays are fixed.

In this embodiment, therefore, the voltage value $V_d$ obtained when the system main relays SMR are OFF is compared with the voltage value $V_d$ obtained when the system main relays SMR are ON, and when there is no voltage difference therebetween it is determined that the system main relays SMR are fixed. With such a configuration, the voltage fluctuations due to the individual differences among the circuit elements can be cancelled.

The characteristic differences resulting from changes in temperature fluctuate depending on the timing at which the voltage values $V_d$ are detected. Therefore, by reducing the time it takes to acquire the voltage value $V_d$ when the system main relays SMR are OFF and the voltage value $V_d$ when the system main relays SMR are ON, whether the system main relays SMR are fixed or not can be determined, with the voltage fluctuations due to the characteristic differences resulting from changes in temperature being cancelled.

Figure 11:
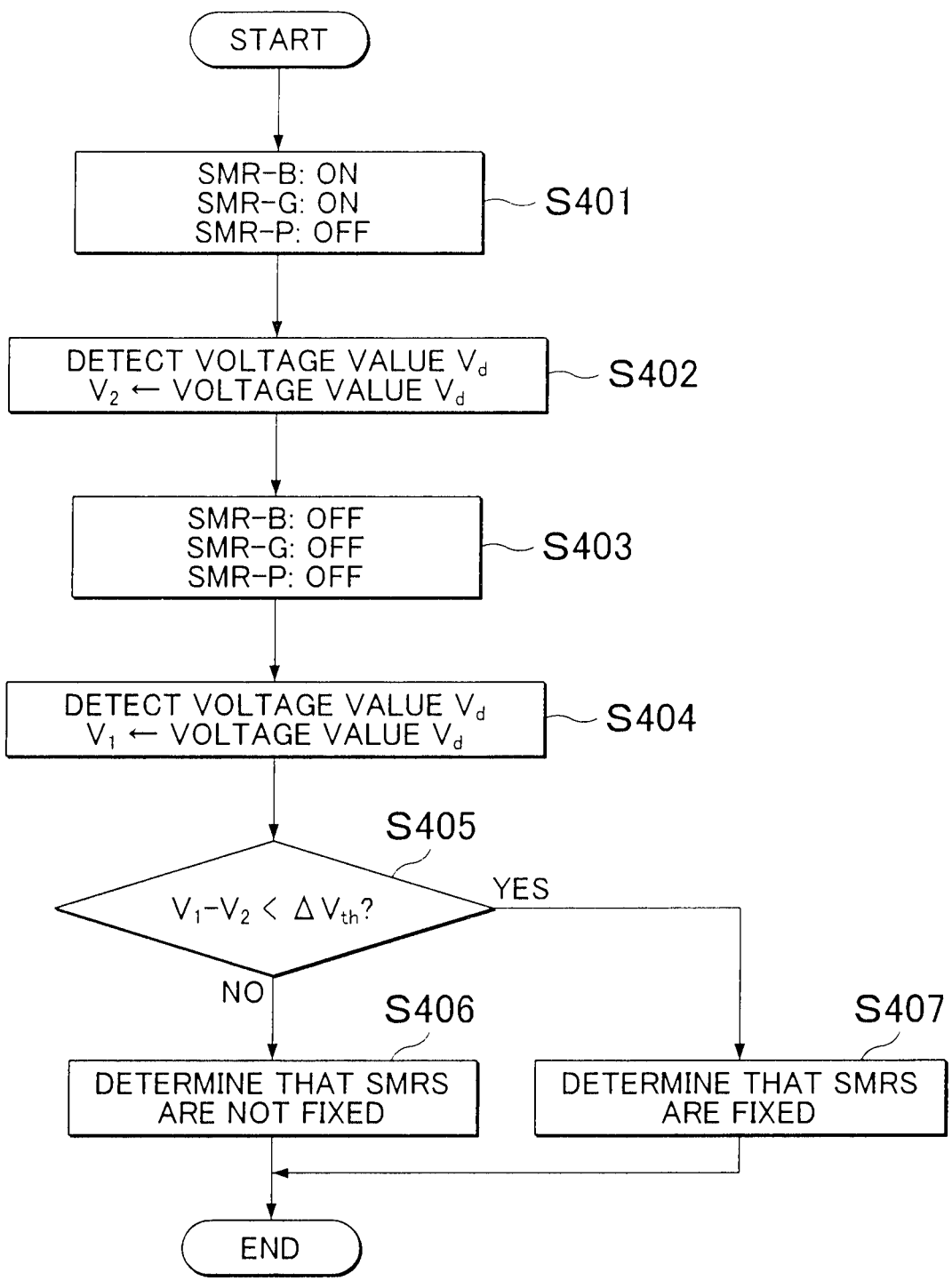
FIG. 11 is a flowchart showing a process for determining whether the system main relay is fixed or not in Embodiment 3.

FIG. 11 is a flowchart showing the process for determining whether the system main relays are fixed or not, the process being executed when the battery system is switched from its activated state (Ready-ON) to its stopped state (Ready-OFF).

In other words, when turning the system main relays SMR-B and SMR-G OFF in order to stop charging/discharging the battery system in its chargeable/dischargeable state where the battery pack 10 and the inverter 31 are connected to each other, the process for determining whether the relays are fixed or not is performed, and, prior to turning the system main relays SMR-B and SMR-G OFF, the voltage value $V_d$ when the system main relays SMR are ON is detected to determine whether the system main relays SMR are fixed or not.

Then the voltage value $V_d$ is detected when the system main relays SMR are OFF after the system main relays SMR-B and SMR-G are turned OFF in response to the stopping of the charging/discharging of the battery system in its chargeable/dischargeable state where the battery pack 10 and the inverter 31 are connected to each other. According to this configuration, it is not necessary to switch the system main relays SMR ON in order to perform the process for determining whether the system main relays are fixed or not. As described in Embodiment 1, this configuration can not only prevent wear of the movable contact points MC and the fixed contact points FC but also determine whether the system main relays are fixed or not, with the individual differences among the circuit elements and the characteristic differences resulting from changes in temperature being minimized.

The process shown in FIG. 11 can be executed after determining that there is no leak in the battery pack 10 in the same manner as in Embodiment 1. The same is true for the process shown in FIG. 12.

In reaction to, for example, a moment where an ignition switch for stopping the activated battery system is turned OFF, in step S401 the controller 60 outputs a control signal for turning the system main relays SMR-B and SMR-G ON and the SMR-P OFF. Since this control step is carried out prior to bringing the battery system to its stopped state (Ready-OFF), the battery system with the system main relays SMR-B and SMR-G turned ON and the system main relay SMR-P OFF should still be activated at this point. Note that in step S401 the controller 60 may output a control signal for turning either one of the system main relays SMR-B and SMR-G ON.

In step S402, the controller 60 detects a voltage value $V_d$ based on the output signal from the leak detection circuit 40 (the voltage sensor 44). The leak detection circuit 40 at this moment outputs an AC signal of a predetermined frequency. The controller 60 stores this detected voltage value $V_d$ in the memory 61 as the voltage value $V_2$ (same as the second detected voltage value) that is obtained when the system main relays SMR are ON.

In step S403, the controller 60 acquires the voltage value $V_2$ and thereafter outputs a control signal for turning the system main relays SMR-B, SMR-G, and SMR-P OFF in order to bring the battery system from its activated state (Ready-ON) to its stopped state (Ready-OFF).

In step S404, the controller 60 detects a voltage value $V_d$ based on the output signal from the leak detection circuit 40 (the voltage sensor 44) after outputting the control signal for turning all of the system main relays SMR OFF. The controller 60 stores this detected voltage value $V_d$ in the memory 61 as the voltage value $V_1$ (same as the first detected voltage value) obtained when all of the system main relays SMR are OFF.

In step S405, the controller 60 determines whether or not the difference between the voltage value $V_2$ detected in step S404 and the voltage value $V_1$ detected in step S402 is smaller than a predetermined voltage difference $\Delta V_{th}$. The voltage difference $\Delta V_{th}$ can be set in advance based on, for example, the voltage difference between the voltage value $V_2$ along the upper limit line of FIG. 10 that is obtained when the system main relays SMR are not fixed and the voltage value $V_1$ obtained when the system main relays SMR are fixed.

When the difference between the voltage value $V_2$ and the voltage value $V_1$ is higher than the voltage difference $\Delta V_{th}$, the controller 60 determines in step S406 that the system main relays SMR-B, SMR-G, and SMR-P are not fixed. When, however, the difference between the voltage value $V_2$ and the voltage value $V_1$ is smaller than the voltage difference $\Delta V_{th}$, the controller determines in step S407 that any of the system main relays SMR-B, SMR-G, and SMR-P is fixed. In step S407 the controller 60 can execute a warning process similar to that performed in step S205 shown in FIG. 7.

Figure 12:
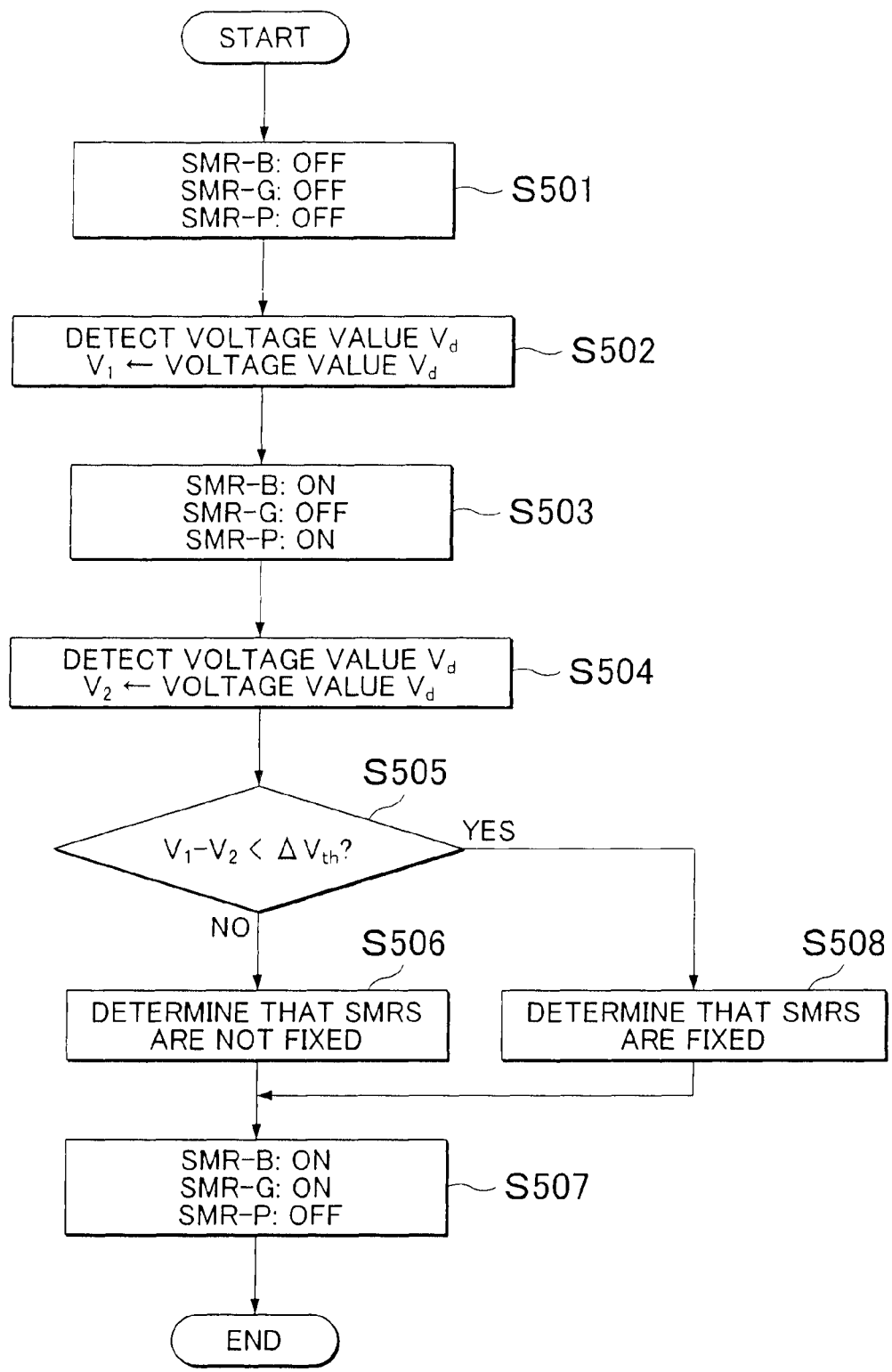
FIG. 12 is a flowchart showing the process for determining whether the system main relay is fixed or not in Embodiment 3.

FIG. 12 is a flowchart showing the process for determining whether the system main relays are fixed or not. Contrary to FIG. 11, this process is executed when the state of the battery system is switched from its stopped state (Ready-OFF) to its activated state (Ready-ON).

In other words, when turning the system main relays SMR-B, SMR-G, and SMR-P ON in order to start charging/discharging the stopped battery system in which the battery pack 10 is not connected to the inverter 31, the process for determining whether the relays are fixed or not is executed, and, prior to turning the system main relays SMR-B, SMR-G, and SMR-P ON, the voltage value $V_d$ when the system main relays SMR are OFF is detected in order to determine whether the system main relays SMR are fixed or not. Then, the voltage value $V_d$ is detected when the system main relays SMR are ON after the system main relays SMR-B, SMR-G, and SMR-P are turned ON in response to the start of the charging/discharging of the stopped battery system in which the battery pack 10 is not connected to the inverter 31. As with the example shown in FIG. 11, this configuration can not only prevent wear of the movable contact points MC and the fixed contact points FC but also determine whether the system main relays are fixed or not, with the individual differences among the circuit elements and the characteristic differences resulting from changes in temperature being minimized.

In reaction to, for example, a moment where the ignition switch is turned ON, in step S501 the controller 60 outputs a control signal for turning the system main relays SMR-B, SMR-G, and SMR-P OFF. Since this control step is carried out prior to bringing the battery system to its activated state (Ready-ON), the battery system with the system main relays SMR-B, SMR-G, and SMR-P turned OFF should still be stopped at this point.

In step S502, the controller 60 detects a voltage value $V_d$ corresponding to an AC signal of a predetermined frequency based on the output signal from the leak detection circuit 40 (the voltage sensor 44). The controller 60 then stores this detected voltage value $V_d$ in the memory 61 as the voltage value $V_1$ to be obtained when the system main relays SMR are OFF.

In step S503, the controller 60 acquiring the voltage value $V_1$ and thereafter outputs a control signal for turning the system main relays SMR-B and SMR-P ON in order to bring the battery system from its stopped state (Ready-OFF) to its activated state (Ready-ON).

In step S504, the controller 60 detects a voltage value $V_d$ based on the output signal from the leak detection circuit 40 (the voltage sensor 44) after outputting the control signal for turning the system main relays SMR ON. The controller 60 stores this detected voltage value $V_d$ in the memory 61 as the voltage value $V_2$ obtained when all of the system main relays SMR are ON.

In step S505, the controller 60 determines whether or not the difference between the voltage value $V_2$ detected in step S504 and the voltage value $V_1$ detected in step S502 is smaller than the predetermined voltage difference $\Delta V_{th}$. The voltage difference $\Delta V_{th}$ can be set beforehand in the same manner as in the example shown in FIG. 11.

When the difference between the voltage value $V_2$ and the voltage value $V_1$ is higher than the voltage difference $\Delta V_{th}$, the controller 60 determines in step S506 that the system main relays SMR-B, SMR-G, and SMR-P are not fixed.

In step S507, the controller 60 switches the OFF-state of the system main relays SMR-G to the ON-state and the ON-state of the system main relay SMR-P to the OFF-state, bringing the battery system to its activated state (Ready-ON).

However, when it is determined in step S505 that the difference between the voltage value $V_2$ and the voltage value $V_1$ is smaller than the voltage difference $\Delta V_{th}$, the controller 60 determines in step S508 that any of the system main relays SMR-B, SMR-G, and SMR-P is fixed.

Note that in step S508 the controller 60 can execute the same warning process as that of step S205 shown in FIG. 7. However, even when it is subsequently determined that any of the system main relays SMR-B, SMR-G, and SMR-P is fixed, the controller 60 can proceed to step S507 to bring the battery system to its activated state (Ready-ON) to enable the vehicle to run temporarily.

When it is determined that any of the system main relays SMR is fixed, the controller 60, without proceeding to step S507, can prohibit the battery system from entering its activated state (Ready-ON), while executing the warning process, and prevent the vehicle from running by the charging/discharging operation of the battery system.

Since the voltage value $V_2$ is acquired in step S503 of FIG. 12 in response to charging the capacitor 22, the time it takes to bring the battery system from its stopped state (Ready-OFF) to its activated state (Ready-ON) can be reduced quicker than when executing step S503 in order to charge the capacitor 22 after it is determined in step S506 that the system main relays SMR-B, SMR-G, and SMR-P are not fixed. In step S503 of the process for determining the fixation of the system main relays SMR, the controller 60 may output a control signal for turning either one of the system main relays SMR-B and SMR-P ON, and then execute step S503 to charge the capacitor 22 after determining in step S506 that the system main relays SMR-B, SMR-G, and SMR-P are not fixed.

Because the resistance element 51 is higher than the resistance element 52, the voltage value $V_d$ obtained when the system main relays SMR are fixed is different from the voltage value $V_d$ obtained when the system main relays SMR are not fixed. When the system main relays SMR are fixed, the voltage difference between these voltage values (differential value) grows small. In this embodiment, since whether the system main relays SMR are fixed or not is determined based on the differential value, the fixation of the system main relays can be determined, with the individual differences among the circuit elements of the leak detection circuit 40 and between the resistance elements 51 and 52 being minimized.

Moreover, because the voltage values $V_1$ and $V_2$ are acquired when turning the system main relays SMR ON/OFF in response to the execution of control on the battery system in its stopped state (read-OFF) and activated state (Ready-ON), it is not necessary to switch the relays ON and OFF in order to determine whether the relays are fixed or not, preventing wear of the relays (the movable contact points and the fixed contact points). In addition, because the voltage values $V_1$ and $V_2$ can be acquired within a short time in response to the execution of control on the battery system in its stopped state (Ready-OFF) and activated state (Ready-ON), whether the system main relays are fixed or not can be determined, with the characteristic differences among the circuit elements of the leak detection circuit 40 and between the resistance elements 51 and 52 resulting from changes in temperature being minimized.

It should be noted that this embodiment does not need to take into consideration the output states of the AC signals of predetermined frequencies from the leak detection circuit 40, as in Embodiment 2. In other words, whether the system main relays SMR are fixed or not is determined based on the differential value between the detected voltage values as with using the individual differences among the circuit elements of the leak detection circuit 40 and between the resistance elements 51 and 52 or the characteristic differences thereof resulting from changes in temperature, preventing (cancelling) the voltage fluctuations caused by variations in frequency of the AC signals.

In this embodiment as well, whether the system main relays SMR are fixed or not may be determined by using the resistance values (calculated resistance values) $R_I$ that are calculated based on the detected voltage values $V_d$. In other words, in respect to the example shown in FIG. 11, in step S405 a resistance value $R_{I\_2}$ is calculated from the formula (2) by using the voltage value $V_2$ ($V_d$) detected in step S402, the reference resistance value $R_d$ of the resistance element 42, and the reference voltage value $V_0$ of the AC power supply 41. Further, a resistance value $R_{I\_1}$ is calculated from the formula (2) by using the voltage value $V_1$ ($V_d$) detected in step S404, the reference resistance value $R_d$ of the resistance element 42, and the reference voltage value $V_0$ of the AC power supply 41.

When the differential value between the calculated resistance values $R_{I\_1}$ and $R_{I\_2}$ (the first resistance value) is larger than a predetermined value $\Delta R_{th}$, the controller 60 proceeds to step S406 to determine that the system main relays SMR-B, SMR-G, and SMR-P are not fixed. However, when it is determined that the differential value between the calculated resistance values $R_{I\_1}$ and $R_{I\_2}$ is smaller than the predetermined value $\Delta R_{th}$, the controller 60 proceeds to step S407 to determine that any of the system main relays SMR-B, SMR-G, and SMR-P is fixed. Note that the predetermined value $\Delta R_{th}$ can be set beforehand, as with the voltage difference $\Delta V_{th}$ described above, based on, for example, the difference in resistance between the resistance value that is calculated from the voltage value $V_2$ along the upper limit line of FIG. 10 at which the system main relays SMR are not fixed, the reference resistance value $R_d$ of the resistance element 42, and the reference voltage value $V_0$ of the AC power supply 41, and the resistance value that is calculated from the voltage value $V_1$ obtained when the system main relays SMR are fixed, the reference resistance value $R_d$ of the resistance element 42, and the reference voltage value $V_0$ of the AC power supply 41.

The same applies to the example shown in FIG. 12, wherein the resistance value $R_{I\_1}$ is calculated from the formula (2) in step S505 by using the voltage value $V_1$ ($V_d$) detected in step S502, the reference resistance value $R_d$ of the resistance element 42, and the reference voltage value $V_0$ of the AC power supply 41. Also, the resistance value $R_{I\_2}$ is calculated from the formula (2) by using the voltage value $V_2$ ($V_d$) detected in step S504, the reference resistance value $R_d$ of the resistance element 42, and the reference voltage value $V_0$ of the AC power supply 41.

When the differential value between the calculated resistance values $R_{I\_1}$ and $R_{I\_2}$ (the second resistance value) is larger than the predetermined value $\Delta R_{th}$, the controller 60 proceeds to step S506 to determine that the system main relays SMR-B, SMR-G, and SMR-P are not fixed. However, when it is determined that the differential value between the calculated resistance values $R_{I\_1}$ and $R_{I\_2}$ is smaller than the predetermined value $\Delta R_{th}$, the controller 60 proceeds to step S508 to determine that any of the system main relays SMR-B, SMR-G, and SMR-P is fixed.

What is claimed is:

1. A system for determining fixation of a relay, the system comprising:
   an electricity storage device;
   an electrical apparatus;
   a relay that is provided on a line connecting the electricity storage device and the electrical apparatus, the relay including a movable contact point and a fixed contact point;
   a first insulation resistor having a first resistance value and disposed between the electricity storage device and a ground;
   a second insulation resistor having a second resistance value and disposed between the electrical apparatus and the ground, the second resistance value being lower than the first resistance value;
   a detection circuit comprising a resistance element having a reference resistance value and an alternating current (AC) supply having a reference voltage value, and configured to output an AC signal to the electricity storage device and detect a voltage value based on the AC signal; and
   a controller configured to:
      determine whether or not the relay is fixed based on the voltage value detected by the detection circuit, when the relay is controlled to be off,
      determine that the relay is fixed when the detected voltage value is a voltage value that is obtained by dividing the reference voltage value by a combined resistance value and the reference resistance value, the combined resistance value being a combined value of the first resistance value and the second resistance value, and
      determine that the relay is not fixed when the detection circuit detects a voltage value that is obtained by dividing the reference voltage value by the first resistance value and the reference resistance value,
   wherein
   when determining, based on the detected voltage value, a decreases in the first resistance value resulting from a leak in the electricity storage device, the detection circuit outputs the AC signal of a first frequency,
   when determining, based on the detected voltage value, whether or not the relay is fixed, the detection circuit outputs the AC signal of a second frequency, the second frequency being lower than the first frequency, and
   when the detected voltage value that is obtained when the AC signal of the first frequency is used is equal to the detected voltage value that is obtained when the AC signal of the second frequency is used, the controller determines that output states of the AC signals from the detection circuit are abnormal.

2. The system for determining fixation according to claim 1, wherein
   the controller determines whether or not the first resistance value decreases due to the leak in the electricity storage device based on the detected voltage value, and
   when the first resistance value does not decrease, the controller determines whether or not the relay is fixed.

3. The system for determining fixation according to claim 1, wherein
   the relay includes a first relay and a second relay, and the movable contact point of the first relay and the movable contact point of the second relay are mechanically connected to each other so as to be integrally operated, the first relay being provided on a line connecting a positive electrode terminal of the electricity storage device and the electrical apparatus, and the second relay being provided on a line connecting a negative electrode terminal of the electricity storage device and the electrical apparatus.

4. A system for determining fixation of a relay, the system comprising:
an electricity storage device;
an electrical apparatus;
a relay that is provided on a line connecting the electricity storage device and the electrical apparatus, the relay including a movable contact point and a fixed contact point;
a detection circuit comprising a resistance element having a reference resistance value and an alternating current (AC) supply having a reference voltage value, and configured to output an AC signal to the electricity storage device and detect a voltage value based on the AC signal; and
a controller configured to:
determine whether or not the relay is fixed based on the voltage value detected by the detection circuit, when the relay is controlled to be off,
determine that the relay is fixed when the detected voltage value is a voltage value that is obtained by dividing the reference voltage value by a combined resistance value and the reference resistance value, the combined resistance value being a combined value of a first resistance value and a second resistance value, and
determine that the relay is not fixed when the detected voltage value is a voltage value that is obtained by dividing the reference voltage value by the first resistance value and the reference resistance value, wherein
the first resistance value is a resistance value of an insulation resistance between the electricity storage device and a ground, the second resistance value is a resistance value of an insulation resistance between the electrical apparatus and the ground, and the first resistance value is higher than the second resistance value,
when determining, based on the detected voltage value, a decreases in the first resistance value resulting from a leak in the electricity storage device, the detection circuit outputs the AC signal of a first frequency,
when determining, based on the detected voltage value, whether or not the relay is fixed, the detection circuit outputs the AC signal of a second frequency, the second frequency being lower than the first frequency, and
when the detected voltage value that is obtained when the AC signal of the first frequency is used is equal to the detected voltage value that is obtained when the AC signal of the second frequency is used, the controller determines that output states of the AC signals from the detection circuit are abnormal.

5. A system for determining fixation of a relay, the system comprising:
an electricity storage device;
an electrical apparatus;
a relay that is provided on a line connecting the electricity storage device and the electrical apparatus, the relay including a movable contact point and a fixed contact point;
a first insulation resistor having a first resistance value between the electricity storage device and a ground;
a second insulation resistor having a second resistance value between the electrical apparatus and the ground, the second resistance value being lower than the first resistance value;
a detection circuit comprising a resistance element having a reference resistance value and an alternating current (AC) supply having a reference voltage value, and configured to output an AC signal to the electricity storage device and detect a voltage value based on the AC signal; and
a controller configured to:
determine whether or not the relay is fixed based on the voltage value detected by the detection circuit, when the relay is controlled to be off,
determine that the relay is fixed when a calculated resistance value calculated from the detected voltage value, the reference voltage value and the reference resistance value being a combined resistance value of the first resistance value and the second resistance value, and
determine that the relay is not fixed when the calculated resistance value is the first resistance value, wherein
when determining, based on the detected voltage value, a decreases in the first resistance value resulting from a leak in the electricity storage device, the detection circuit outputs the AC signal of a first frequency,
when determining, based on the detected voltage value, whether or not the relay is fixed, the detection circuit outputs the AC signal of a second frequency, the second frequency being lower than the first frequency, and
when the detected voltage value that is obtained when the AC signal of the first frequency is used is equal to the detected voltage value that is obtained when the AC signal of the second frequency is used, the controller determines that output states of the AC signals from the detection circuit are abnormal.

6. A system for determining fixation of a relay, the system comprising:
an electricity storage device;
an electrical apparatus;
a relay that is provided on a line connecting the electricity storage device and the electrical apparatus, the relay including a movable contact point and a fixed contact point;
a detection circuit comprising a resistance element having a reference resistance value and an alternating current (AC) supply having a reference voltage value, and configured to output an AC signal to the electricity storage device and detect a voltage value based on the AC signal; and
a controller configured to:
determine whether or not the relay is fixed based on the voltage value detected by the detection circuit, when the relay is controlled to be off,
determine that the relay is fixed when a calculated resistance value calculated from the detected voltage value, the reference voltage value and the reference resistance value is a combined resistance value of a first resistance value and a second resistance value, and
determine that the relay is not fixed when the calculated resistance value is the first resistance value, wherein
the first resistance value is a resistance value of an insulation resistance between the electricity storage device and a ground, the second resistance value is a resistance value of an insulation resistance between the electrical apparatus and the ground, and the first resistance value is higher than the second resistance value,
when determining, based on the detected voltage value, a decreases in the first resistance value resulting from a leak in the electricity storage device, the detection circuit outputs the AC signal of a first frequency, when determining, based on the detected voltage value, whether or not the relay is fixed, the detection circuit outputs the AC signal of a second frequency, the second frequency being lower than the first frequency, and when the detected voltage value that is obtained when the AC signal of the first frequency is used is equal to the detected voltage value that is obtained when the AC signal of the second frequency is used, the controller determines that output states of the AC signals from the detection circuit are abnormal.

7. A system for determining fixation of a relay, the system comprising:
   an electricity storage device;
   an electrical apparatus;
   a relay that is provided on a line connecting the electricity storage device and the electrical apparatus, the relay including a movable contact point and a fixed contact point;
   a detection circuit configured to:
     output an alternating current (AC) signal of a reference voltage value to the electricity storage device,
     detect a voltage value obtained by dividing the reference voltage value by a reference resistance value,
     detect a voltage value obtained by dividing the reference voltage value by a combined resistance value and the reference resistance value, the combined resistance value being a combined resistance value of a first resistance value and a second resistance value, and
     the first resistance value being a resistance value of an insulation resistance between the electricity storage device and a ground, the second resistance value being a resistance value of an insulation resistance between the electrical apparatus and the ground, and the first resistance value being higher than the second resistance value, and
   a controller configured to:
     determine whether or not the relay is fixed based on a first detected voltage value and a second detected voltage value,
     determine that the relay is fixed when any one of a first voltage difference and a second voltage difference is less than a predetermined value, and
     determine that the relay is not fixed when any one of the first voltage difference and the second voltage difference is greater than the predetermined value,
     the first detected voltage value being detected by the detection circuit when the relay is controlled to be off,
     the second detected voltage value being detected by the detection circuit when the relay is controlled to be on,
     the first voltage difference being a voltage difference between the second detected voltage value that is detected before the relay is controlled to be off when charging/discharging between the electricity storage device and the electrical apparatus is ended, and the first detected voltage value that is detected after the relay is controlled to be off in response to completion of the charging/discharging, and
     the second voltage difference being a voltage difference between the first detected voltage value that is detected before the relay is controlled to be on when charging/discharging between the electricity storage device and the electrical apparatus is started, and the second detected voltage value that is detected after the relay is controlled to be on in response to the start of the charging/discharging.

8. A system for determining fixation of a relay, the system comprising:
   an electricity storage device;
   an electrical apparatus;
   a relay that is provided on a line connecting the electricity storage device and the electrical apparatus, the relay including a movable contact point and a fixed contact point;
   a detection circuit configured to:
     output an alternating current (AC) signal of a reference voltage value to the electricity storage device,
     detect a voltage value obtained by dividing the reference voltage value by a reference resistance value; and
     detect a voltage value obtained by dividing the reference voltage value by a combined resistance value and the reference resistance value, the combined resistance value being a combined value of a first resistance value and a second resistance value,
     the first resistance value being a resistance value of an insulation resistance between the electricity storage device and a ground, the second resistance value being a resistance value of an insulation resistance between the electrical apparatus and the ground, and the first resistance value being higher than the second resistance value, and
   a controller configured to:
     determine whether or not the relay is fixed, based on a first detected voltage value and a second detected voltage value,
     determine that the relay is fixed when any one of a first resistance difference and a second resistance difference is less than a predetermined value, and
     determine that the relay is not fixed when any one of the first resistance difference and the second resistance difference is greater than the predetermined value,
     the first detected voltage value being detected by the detection circuit when the relay is controlled to be off,
     the second detected voltage value being detected by the detection circuit when the relay is controlled to be on,
     the first resistance difference being a difference between a second calculated resistance value and a first calculated resistance value, the second resistance difference being a difference between a third calculated resistance value and a forth calculated resistance value,
     the second calculated resistance value being a value which is calculated from the second detected voltage value detected before the relay is controlled to be off when charging/discharging between the electricity storage device and the electrical apparatus is ended, the reference voltage value, and the reference resistance value,
     the first calculated resistance value being a value which is calculated from the first detected voltage value detected after the relay is controlled to be off in response to completion of the charging/discharging, the reference voltage value, and the reference resistance value,
     the third calculated resistance value being a value which is calculated from the first detected voltage value detected before the relay is controlled to be on when charging/discharging between the electricity storage device and the electrical apparatus is started, the reference voltage value, and the reference resistance value, and the forth calculated resistance value being a value which is calculated from the second detected voltage value detected after the relay is controlled to on in response to the start of the charging/discharging, the reference voltage value, and the reference resistance value.

\* \* \* \* \*